(12) United States Patent
Kondo et al.

(10) Patent No.: US 6,786,417 B1
(45) Date of Patent: Sep. 7, 2004

(54) MEMORY CARD WITH WRITE PROTECTION SWITCH

(75) Inventors: Yoshio Kondo, Chiba (JP); Toshiharu Kobayashi, Tokyo (JP); Takumi Okaue, Kanagawa (JP); Akira Sassa, Saitama (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 09/484,306

(22) Filed: Jan. 18, 2000

Related U.S. Application Data

(63) Continuation-in-part of application No. 09/088,590, filed on Jun. 2, 1998, now Pat. No. 6,109,939, and a continuation-in-part of application No. 09/086,788, filed on May 28, 1998, now Pat. No. 6,170,743.

(30) Foreign Application Priority Data

| Jun. 4, 1997 | (JP) | 9-146913 |
| Jun. 4, 1997 | (JP) | 9-146914 |
| Sep. 30, 1997 | (JP) | 9-267181 |

(51) Int. Cl.$^7$ .................. G06K 7/08; G06F 12/100; G06F 13/100; G06F 12/14; G06F 12/16; G06F 13/28

(52) U.S. Cl. .................. 235/492; 235/492; 235/493; 235/379; 235/380; 235/449; 902/25; 902/26; 711/100

(58) Field of Search .............. 235/451, 375, 235/380, 441, 486, 487, 492, 493, 379, 449, 383, 385, 387; 360/2, 131, 132, 135; 369/272; 711/4, 115, 100; 439/946; 365/52; 361/684; 257/628; 902/25, 26

(56) References Cited

U.S. PATENT DOCUMENTS 4,454,414 A    6/1984  Benton
4,532,419 A  * 7/1985  Takeda ................ 235/492
4,625,276 A   11/1986 Benton et al.
4,630,201 A  * 12/1986 White .................. 705/44
4,652,976 A  *  3/1987 Fushimoto ............ 361/684
4,780,604 A  * 10/1988 Hasegawa et al. ...... 235/492
4,797,542 A  *  1/1989 Hara ................... 235/380
4,807,895 A     2/1989 Thomas et al.
4,843,226 A     6/1989 Kato et al.

(List continued on next page.)

FOREIGN PATENT DOCUMENTS

| EP | 0 263 746 B1 | 4/1988 |
| JP | 60-53144 | 4/1985 |
| JP | 61-55295 | 4/1986 |
| JP | 61-126485 | 8/1986 |
| JP | 62-7686 | 1/1987 |
| JP | 62-48097 | 3/1987 |
| JP | 62-97896 | 5/1987 |
| JP | 62-112767 | 7/1987 |
| JP | 62-119274 | 7/1987 |

(List continued on next page.)

*Primary Examiner*—Karl D. Frech
*Assistant Examiner*—Daniel Walsh
(74) *Attorney, Agent, or Firm*—Frommer Lawrence & Haug LLP; William S. Frommer

(57) ABSTRACT

A memory card and apparatus used therewith. The memory card comprises a rectangular card body having terminals in the vicinity of one end and a storage device disposed in the card body for storing data. A switch on the card is operable to a state to prevent stored data from being erased; and a status signal representing the state of the switch is supplied to one or more of the terminals. The apparatus with which the card is used has mating terminals to receive the status signal. Depending upon the state of that status signal, the apparatus is selectively inhibited from writing data to the memory card or erasing data stored in the memory card.

32 Claims, 24 Drawing Sheets

U.S. PATENT DOCUMENTS

| | | | |
|---|---|---|---|
| 4,937,601 A | * 6/1990 | Azuma et al. | 396/410 |
| 4,990,760 A | 2/1991 | Tomari et al. | |
| 5,016,086 A | * 5/1991 | Inoue et al. | 174/52.4 |
| 5,036,430 A | 7/1991 | Hills | |
| 5,047,894 A | 9/1991 | Onoda et al. | |
| 5,072,103 A | 12/1991 | Nara | |
| 5,083,286 A | 1/1992 | Hino et al. | |
| 5,173,816 A | * 12/1992 | Ogihara | 360/69 |
| 5,176,528 A | 1/1993 | Fry et al. | |
| 5,245,582 A | 9/1993 | Kimura | |
| 5,267,218 A | 11/1993 | Elbert | |
| 5,388,248 A | * 2/1995 | Robinson et al. | 235/380 |
| 5,422,855 A | 6/1995 | Eslick et al. | |
| 5,436,621 A | * 7/1995 | Macko et al. | 340/7.54 |
| 5,455,572 A | * 10/1995 | Cannon et al. | 340/7.54 |
| 5,504,701 A | 4/1996 | Takahashi et al. | |
| 5,537,584 A | 7/1996 | Miyai et al. | |
| 5,568,134 A | * 10/1996 | Cannon et al. | 340/7.54 |
| 5,581,127 A | 12/1996 | Shinohara | |
| 5,678,029 A | 10/1997 | Iijima | |
| 5,710,421 A | * 1/1998 | Kokubu | 235/380 |
| 5,745,912 A | 4/1998 | Konishi et al. | |
| 5,751,765 A | * 5/1998 | Matsubara | 235/380 |
| 5,775,925 A | 7/1998 | Tondreault | |
| 5,808,997 A | * 9/1998 | Yamamiya | 369/75.1 |
| 5,832,285 A | * 11/1998 | Shimada | 713/320 |
| 5,865,651 A | 2/1999 | Dague et al. | |
| 5,925,928 A | * 7/1999 | Hafner et al. | 257/679 |
| 6,011,677 A | * 1/2000 | Rose | 360/131 |
| 6,021,029 A | * 2/2000 | Mamiya et al. | 360/133 |
| 6,109,939 A | * 8/2000 | Kondo et al. | 439/140 |
| 6,145,023 A | * 11/2000 | Iwasaki | 340/870.16 |
| 6,170,743 B1 | * 1/2001 | Okaue et al. | 235/379 |
| 6,330,634 B1 | * 12/2001 | Fuse et al. | 365/218 |
| 6,343,744 B1 | * 2/2002 | Shibata et al. | 235/380 |
| 6,361,369 B1 | * 3/2002 | Kondo et al. | 439/630 |
| 6,501,163 B1 | * 12/2002 | Utsumi | 257/679 |
| 2002/0137386 A1 | * 9/2002 | Abe et al. | 439/377 |

FOREIGN PATENT DOCUMENTS

| | | |
|---|---|---|
| JP | 62-179037 | 8/1987 |
| JP | 62-184894 | 8/1987 |
| JP | 62-147064 | 9/1987 |
| JP | 63-90092 | 4/1988 |
| JP | 63-148457 | 6/1988 |
| JP | 63-135464 | 9/1988 |
| JP | 2-5138 | 1/1990 |
| JP | 2-35584 | 2/1990 |
| JP | 2-123491 | 5/1990 |
| JP | 3-124397 | 12/1991 |
| JP | 4-286089 | 10/1992 |
| JP | 5-047189 | 2/1993 |
| JP | 5-108898 | 4/1993 |
| JP | 5-173888 | 7/1993 |
| JP | 8-72418 | 12/1993 |
| JP | 5-334787 | 3/1996 |
| JP | 8-130061 | 5/1996 |
| JP | 9-198834 | 7/1997 |
| JP | 10-171938 | 6/1998 |
| JP | 2001135383 A * | 5/2001 |

* cited by examiner

MEMORY CARD WITH WRITE PROTECTION SWITCH

This is a Continuation-in-Part of application Ser. No. 09/088,590, filed Jun. 2, 1998, now U.S. Pat. No. 6,109,939; and application Ser. No. 09/086,788, filed May 28, 1998, now U.S. Pat. No. 6,170,743.

FIELD OF THE INVENTION

The present invention relates to a memory card designed for reception in a memory card receptacle and into or from which information is written or read, the memory card having erasure prevention.

DESCRIPTION OF RELATED ART

A well-known memory card incorporating memory chips in which information signals are stored is provided with terminals which are to be electrically connected with an external system. The memory card is supplied with a voltage through the terminals and also delivers and receives information signals to and from the internal memory chips through the terminals.

Since the terminals for connection of the memory card to an external system are also electrically connected to the internal memory chips, they should be protected from being touched when the memory card is used. More particularly, if the terminals are directly touched, a static electricity will take place in them, which although rare, will be transmitted from the terminals to the memory chips, thereby causing damage. To avoid this, the terminals should be protected against easy access from outside.

Also, a desirable feature of the memory card of this type is its transportability. To design more compact memory cards, thus taking advantage of their portability, their terminals have been designed to be thinner and closer together.

Such thin, closely disposed terminals for connection to an external system will possibly be deformed and broken even if just lightly touched.

To prevent the terminals from being deformed or broken, it has been proposed to bury such terminals inside the memory card body and small holes communicating with the terminals are formed in the memory card body so that the terminals are exposed only through the holes. In another proposal, a concavity is formed in a forward, or leading, end portion of the memory card body and terminals are disposed in the bottom of the concavity where they are protected.

However, the memory card in which the terminals are exposed through small holes is difficult to disconnect from a receptacle therefor if the holes are clogged with dust or the like. When the memory card is inserted into the receptacle with clogged holes, no positive connection with the receptacle can be attained and also the terminals of the receptacle may possibly be deformed.

Further, the above memory card is apt to have a complicated structure and is expensive to manufacture. Therefore, this type of memory card is not suitable for mass production.

Also, in the memory card having a concavity in the body in which the terminals are disposed, the terminals cannot be satisfactorily protected if the concavity is improperly shaped. For example, dust or the like is likely to heap or stay in the corners of the concavity and block the terminals of the memory card from secure connection with the terminals of the receptacle.

As a data storage device, the memory card should have an erroneous erase prevention switch for preventing erroneous erasure of data stored therein. However, if the erase prevention switch is provided on a main plane of the memory card body, a user cannot operate the switch when the memory card is mounted in the receptacle of an electronic apparatus. For example, if the memory card is inserted into an electronic apparatus and the user finds that the memory card is disabled for writing (that is, erasure is prevented), the user cannot write new data over data already stored. The user must eject the memory card from the electronic apparatus, set the erase prevention switch to a write state, and then re-insert the memory card into the electronic apparatus. This is inconvenient, troublesome and often frustrating.

SUMMARY OF THE INVENTION

The present invention has as an object to overcome the above-mentioned drawbacks by providing a memory card having a simple structure, adapted to positively protect the terminals thereof and attain a positive connection with a memory card receptacle.

Another object is to provide a memory card capable of preventing erroneous erasure or over-writing of stored data while enabling the erase prevention switch to be set to a desired mode, or state.

The above objects can be accomplished by providing a memory card comprising a rectangular shaped body, a concavity open at the top and formed proximate the leading edge of the card body, and terminals disposed in the concavity. The memory card has also a projection, or rib, formed in at least a part of the space between adjacent terminals in the concavity to protect the terminals from being touched from the outside. The projections define sockets in which are disposed respective terminals.

In one embodiment, the memory card according to the present invention includes a storage device for storing data supplied from the terminals by external apparatus, a switch settable to inhibit the writing of data into the storage device, and a control device for controlling writing of data into the storage device.

In the memory card, the switch can be operated even when the memory card is mounted on or received by the external apparatus; and the control device detects the state of the switch when data from the control apparatus is to be written into the memory card, thereby sending a write enable signal to the external apparatus when the switch is set to a write mode, and sending a write disable signal to the external apparatus when the switch is set to a write disable mode. For example, the external apparatus may include a data store; and when a write enable signal is received from the memory card, data stored in the data store is read out and written to the memory card, whereas when a write disable signal is received from the memory card, read out of the data from the data store is inhibited.

BRIEF DESCRIPTION OF THE DRAWINGS

The foregoing objects, features and advantages of the present intention will become more apparent from the following detailed description of preferred embodiments taken in conjunction with the accompanying drawings, in which.

DETAILED DESCRIPTION OF THE PREFERRED EMBODIMENTS

A memory card according to the present invention is generally indicated with a reference 1.

Figure 1A:
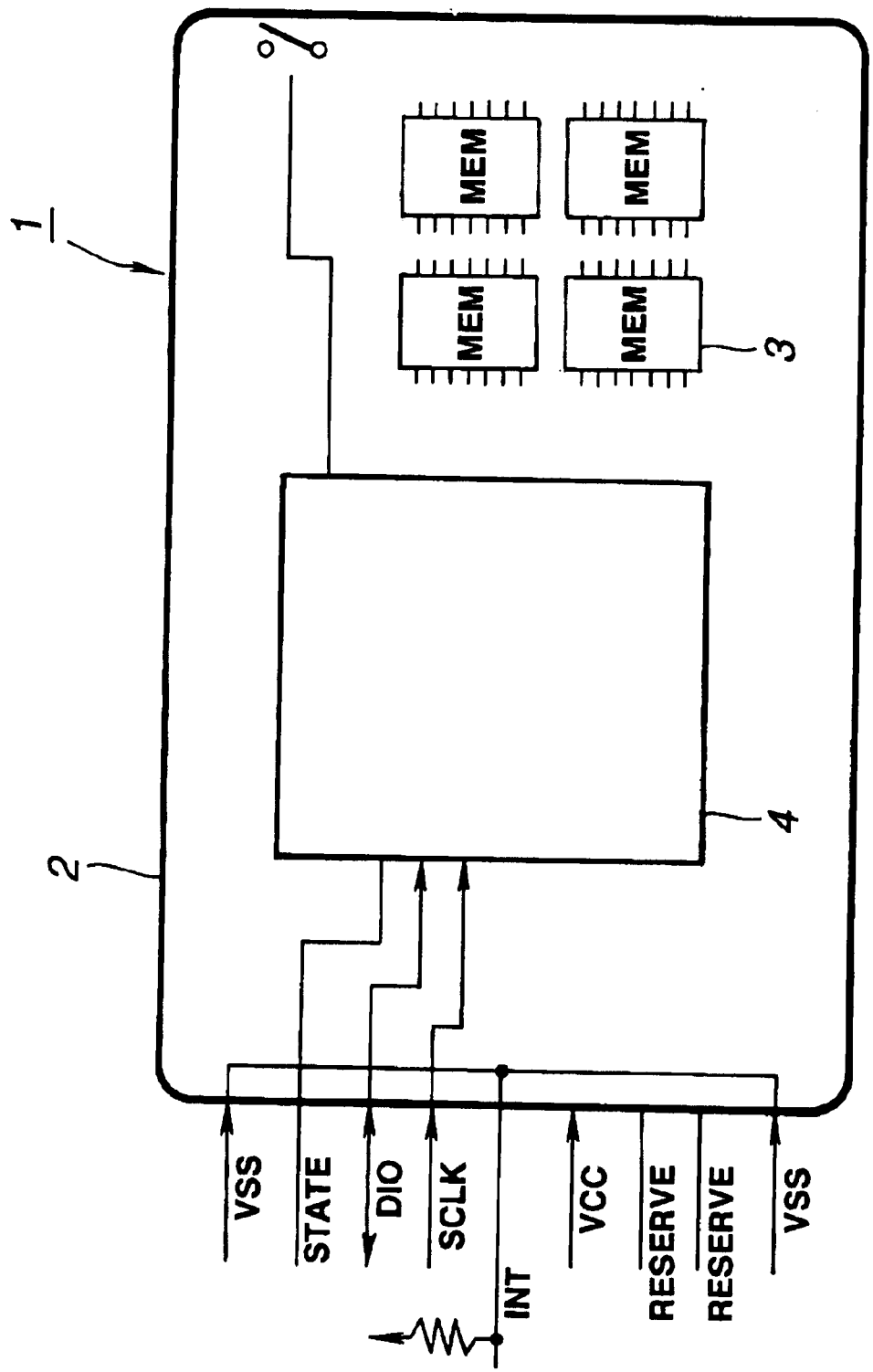
FIG. 1A shows the construction of a first embodiment of the memory card according to the present invention.
Figure 1B:
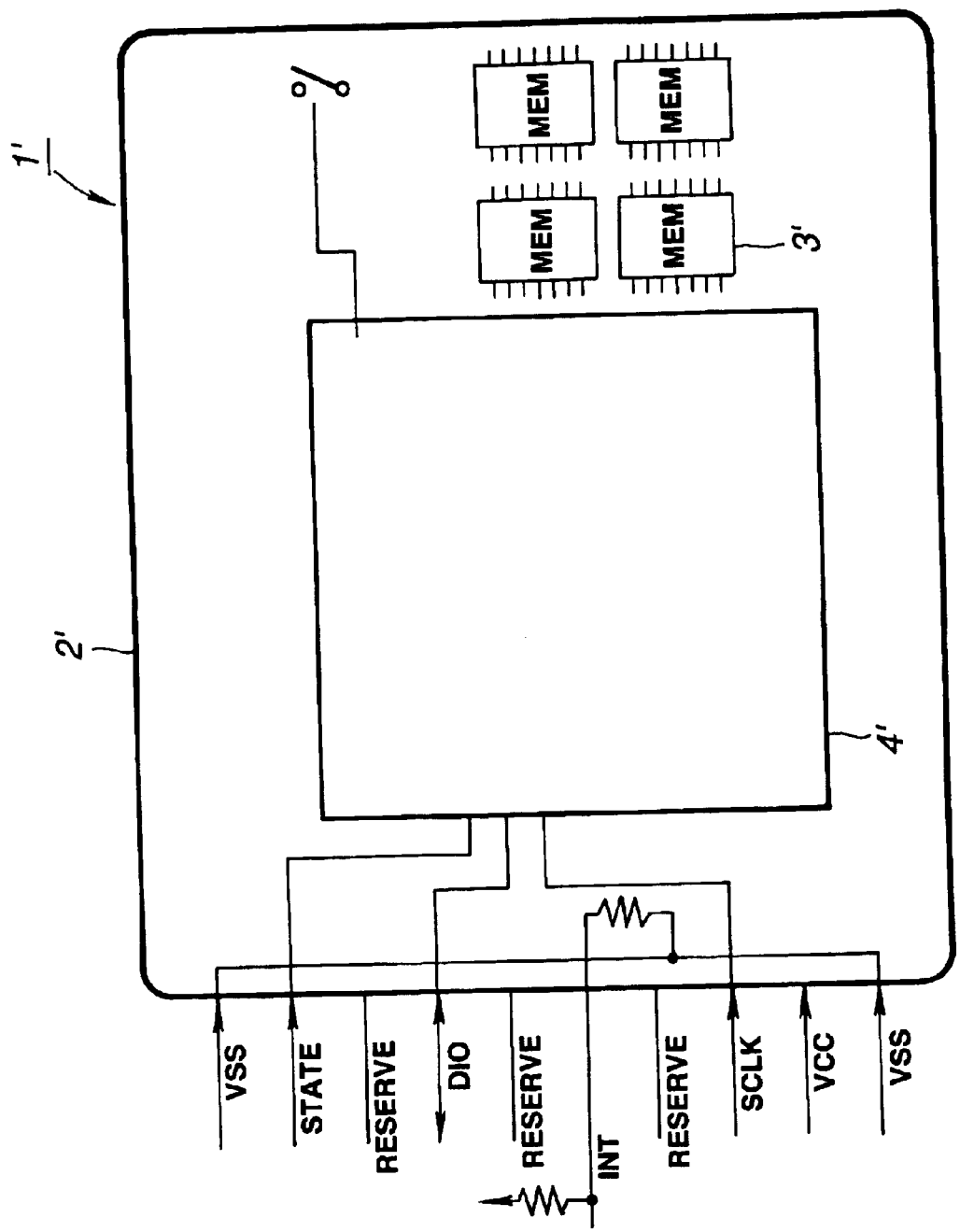
FIG. 1B shows the construction of a second embodiment of the memory card of the present invention.

It is a storage medium which is inserted, for use, into a receptacle of an external system such as a computer, audio equipment, etc. for read or write of information signal between the memory card and external system thus connected to the memory card. As shown in FIGS. 1A and 1B, the memory card 1 has a card body 2 incorporating a plurality of memory chips 3 such as flash memory, etc. to store information signal, and a controlling integrated circuit 4 (will be referred to as "controlling IC" hereafter) to write or read information signal into or from the memory chips 3.

Figure 2:
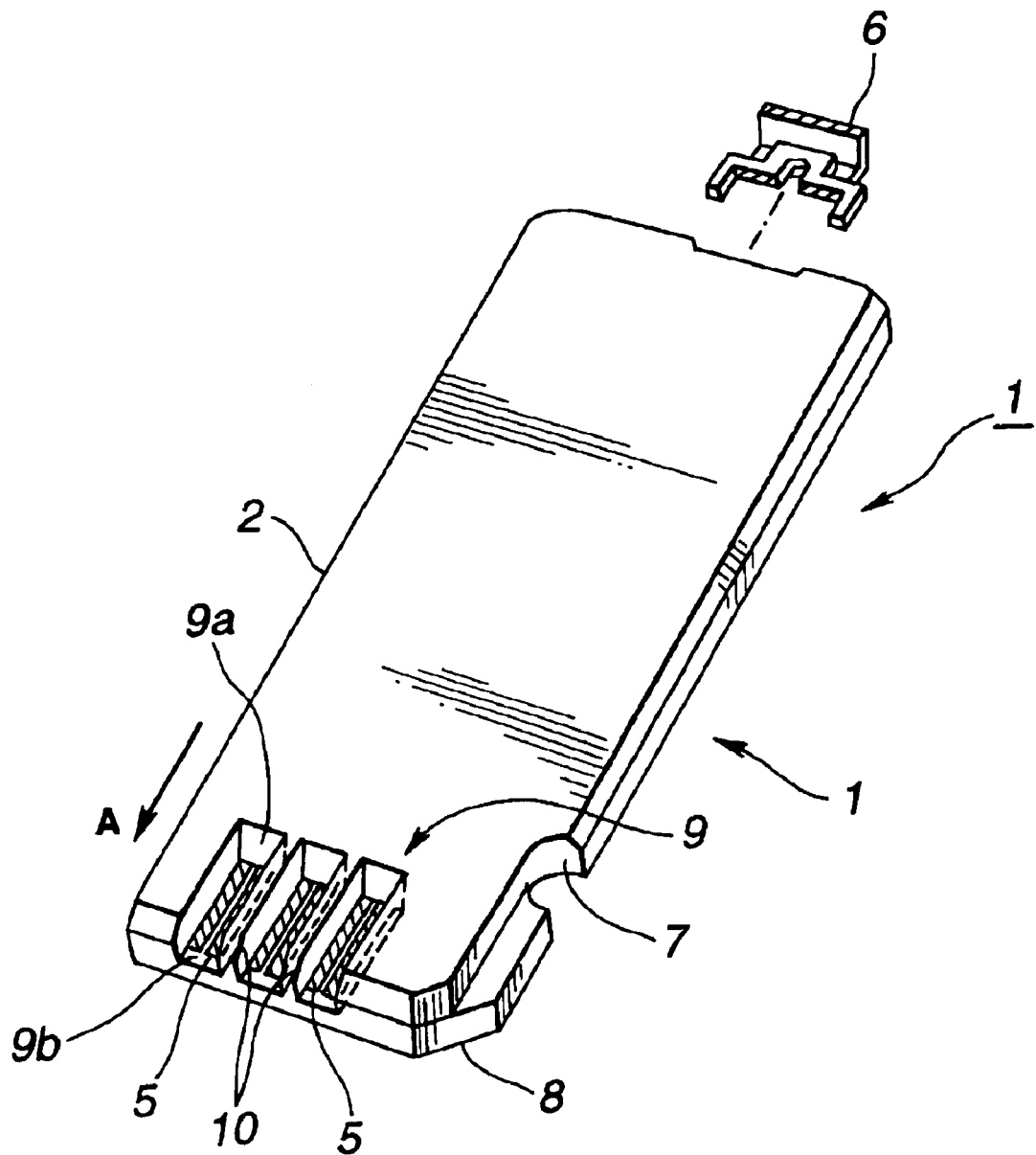
FIG. 2 is a perspective view of the memory card in FIG. 1A.

Further, the memory card 1 has terminals 5 for connection to an external system as shown in FIG. 2. When the memory card 1 is inserted into a memory card receptacle, the terminals 4 are electrically connected to those of the memory card receptacle to supply a voltage to the controlling IC 4 and transfer information signal and various control signals between the memory card 1 and the external system. The memory card 1 adopts a serial interface and the terminals 5 provided count nine in number.

Figure 3:
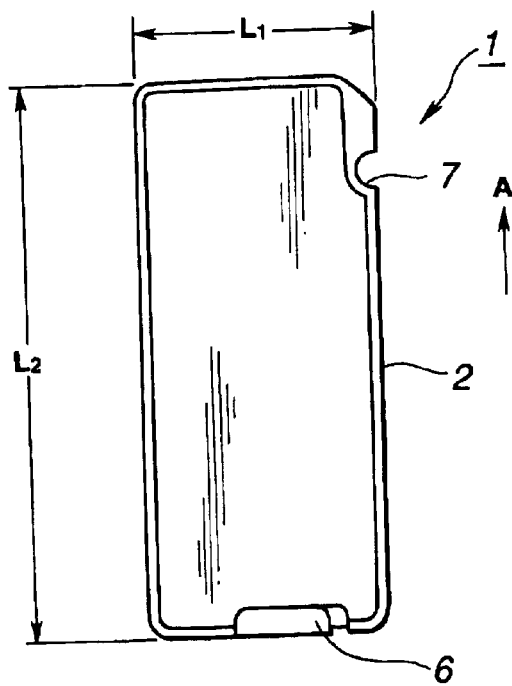
FIG. 3 is a bottom view of the memory card in FIG. 1A.

The card body 2 is a thin, flat, rectangular card made of a synthetic resin, for example. The memory card 1 of this embodiment adopts the serial interface and is designed to have nine terminals 5, and thus the card body 2 itself is small. As shown in FIG. 3, the card body 2 has a short side $L_1$ of which the length is smaller than a half of the length $L_2$ of the long side. For example, $L_1$ is 21.5 mm while $L_2$ is 50 mm, and the thickness of the card body 2 is 2.8 mm.

The card body 2 has an inadvertent erasure—preventive member 6 attached to the rear end thereof in the inserting direction of the card body 2 indicated with an arrow A in FIGS. 2 and 3. The inadvertent erasure—preventive member 6 is engaged on an inadvertent erasure—preventive switch (not illustrated) housed in the card body 2. Sliding the member 6 in a direction perpendicular to the inserting direction of the card body 2 will turn on/off the inadvertent erasure-preventive switch. Also, the card body 2 has formed on a lateral side thereof parallel to the inserting direction of the card body 2 an arcuate locking cut 7 which prevents the memory card 1 from being freely disengaged from the memory card receptacle once the memory card 1 is inserted in the receptacle. When the memory card 1 is inserted into the receptacle, a mating locking projection (not illustrated) provided on the receptacle is engaged in this locking cut 7 to prevent the memory card 1 from being freely disengaged from the receptacle.

At one lateral end in the inserting direction, the card body 2 is cut (at 8) obliquely with respect to the inserting direction of the card body 2. This cut 8 is formed to prevent the memory card 1 from being incorrectly inserted into the receptacle. Further, the card body 2 has formed a concavity 9 formed at the forward end, in the inserting direction, thereof.

The concavity 9 is formed open to the forward end of the card body 2 and extends longitudinally from the forward end, in the inserting direction, of the card body 2. The concavity 9 is deep a predetermined step from the top surface of the card body 2, and thus it is defined by three walls and a bottom 9b. One 9a of the walls of the concavity 9, inner and parallel to the forward open end, is inclined at a predetermined angle with respect to the bottom 9b.

Because of the forward open end and inclined inner wall 9a of the concavity 9 in the memory card 1, dust or the like in the concavity 9 can be easily let out when the memory card 1 is inserted into the receptacle.

In the concavity 9, there is disposed a plurality of terminals 5 for connection to corresponding terminals of the receptacle when the card body 2 is inserted into the receptacle. The terminals 5 are formed by punching a thin metal sheet or from a pattern of a printed wiring board. They are laid side by side on the bottom 9b of the concavity 9 in the inserting direction of the card body 2, and exposed to outside.

Since the memory card 1 of the present invention adopts the serial interface, the terminals 5 thus provided count nine in number. Namely, the nine terminals 5 disposed in the concavity 9 of the memory card 1 include a digital signal input/output terminal, a sync signal input terminal, a status signal input terminal, four voltage supply terminals, and two reserved terminals.

Further, there are formed between the terminals 5 inside the concavity 9 projections 10 serving to prevent an access or touch to the terminals 5 from outside. As shown in FIG. 2, for example, the projections 10 extend between the open forward end and the inner wall 9a of the concavity 9 parallel to the forward end, and count two in number to trisect the space in the concavity 9 in this case. Three terminals 5 are disposed in three sockets, respectively, defined by the projections 10 thus formed inside the concavity 9.

The projections 10 provided in the concavity 9 of the memory card 1 will prevent the user from inadvertently touching the terminals 5 when inserting the memory card 1 into the receptacle. The terminals 5 can be thus protected.

The central one of the terminals 5 disposed in the three sockets defined by the projections 10 in the concavity 9 should desirably be connected to the ground potential.

Since the memory card 1 is connected at the central one of the terminals 5 to the ground potential, even when the user's finger is put into the concavity 9, it will touch the grounded one of the terminals 5 so that a static electricity, if any, caused by touching the terminals 5 with the finger will be connected to the earth and thus the memory chip 3 will not be damaged by the static electricity.

Figure 4:
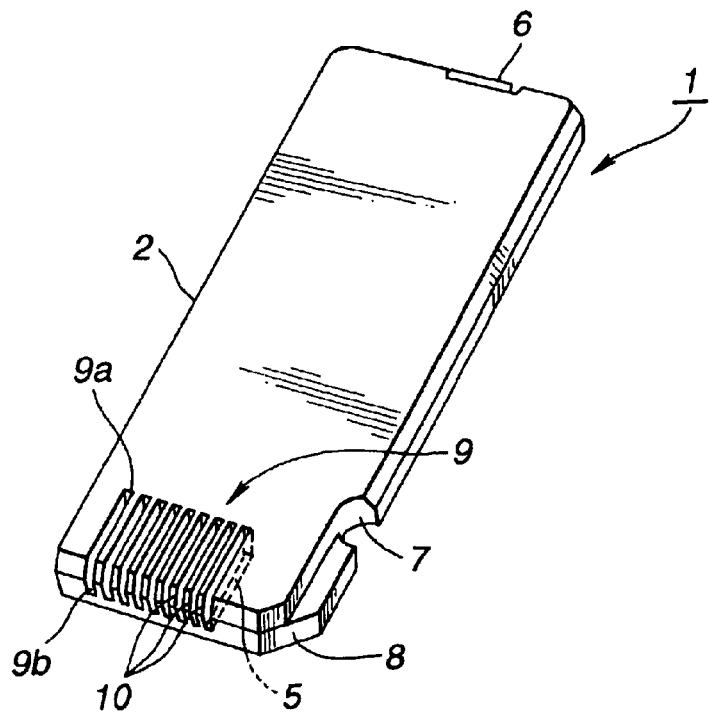
FIG. 4 is a perspective view of a third embodiment of the memory card according to the present invention.

As shown in FIG. 4, the memory card 1 may have formed in the concavity 9a corresponding number of the projections 10 to a desired number of the terminals 5, and have the terminals 5 disposed in the sockets, respectively, defined by the projections 10 in the concavity 9. The projections 10 thus formed for the terminals 5 will positively prevent the terminals 5 being accessed or touched from outside.

It should be noted that ten terminals 10 may be provided in the memory card 1 as shown in FIG. 1B. Three of these ten terminals 5 may be reserved ones. In the memory card 1 with such ten reserved terminals 5, the three reserved terminals 5 can be used as signal input or output terminals to permit a parallel interface using a total of four signal input or output terminals including the aforementioned digital signal input/output terminal.

Figure 5A:
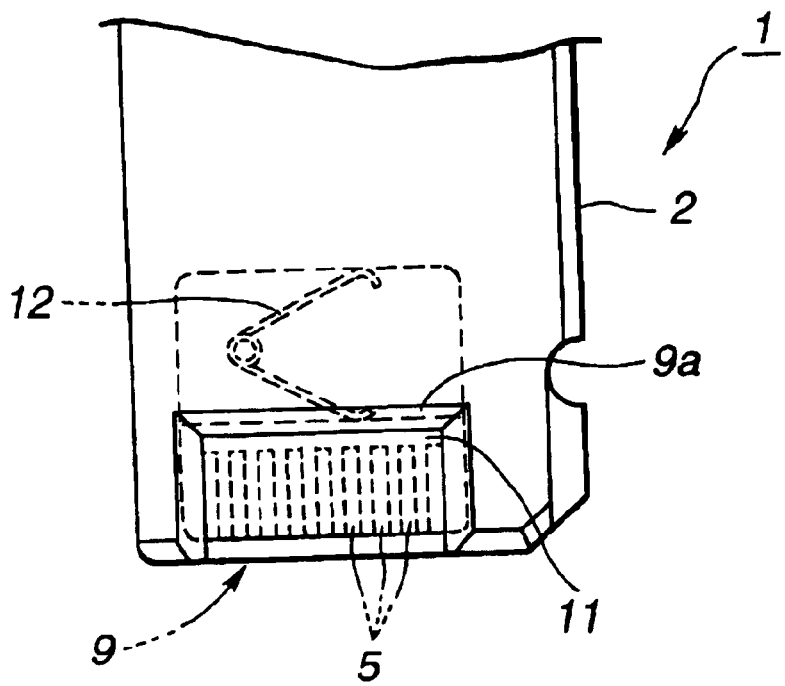
FIG. 5A is a plan view of a fourth embodiment of the memory card according to the present invention, showing the essential portion thereof with a shutter member placed to close or cover the concavity.

The present invention has been described in the foregoing concerning an embodiment in which the projections 10 are formed in the concavity to prevent access—or touch to the terminals 5. However, the memory card 1 according to the present invention may comprise a shutter member 11 which is moved to open or close the concavity 9. As shown in FIG. 5A, when the memory card 1 is not inserted in the receptacle, the shutter member 11 closes the concavity 9 to prevent access to the terminals 5. In this embodiment, the card body 2 has formed therein, over an axial distance substantially corresponding to the axial length of the concavity 9 from the inner wall 9a parallel to the forward end of the concavity 9, an indentation in which the shutter member 11 is slidable.

The shutter member 11 is a rectangular plate made of a synthetic resin, for example, and slightly larger in area than the top opening of the concavity 9, and it is installed at the forward end of the card body 2 to be movable in the inserting direction. While the memory card 1 is not inserted in the receptacle, the shutter member 11 is pressed to the forward end of the concavity 9 to cover the top opening of the concavity 9.

Figure 5B:
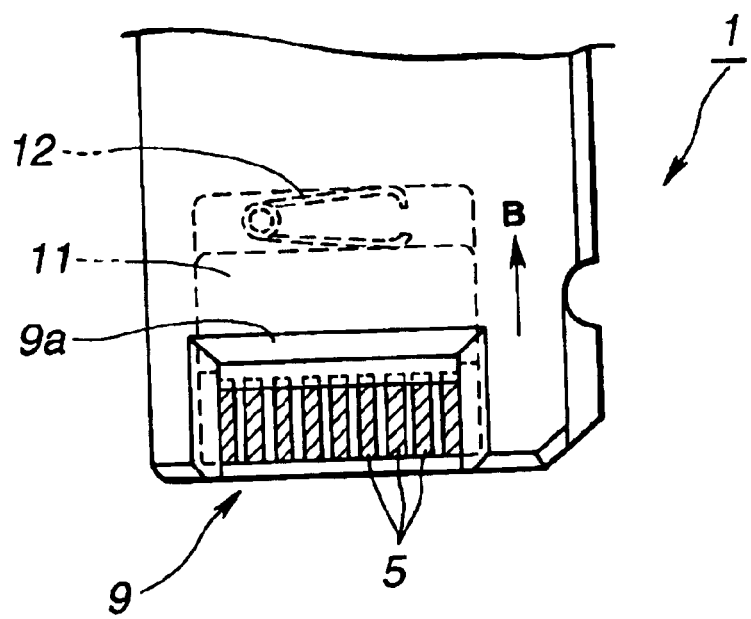
FIG. 5B is a plan view of the memory card in FIG. 5A, showing the essential portion thereof with the shutter member placed to open the concavity.

When the memory card 1 is inserted into the receptacle, it will abut at the forward end thereof on projections of the receptacle as will be further described later. As shown in FIG. 5B, as the memory card 1 is inserted, the shutter member 11 is pushed in by the projections against the force of a spring member 12 in the direction of arrow B, and moved into the above-mentioned indentation so that the concavity 9 will be open at the top thereof.

When the memory card 1 is not inserted into the receptacle, the concavity 9 is covered by the shutter member 11, so that the terminals 5 are prevented from being accessed or touched from outside and thus protected.

In the memory card 1 according to this embodiment as well, the inner wall 9a parallel to the forward open end of the concavity 9 is inclined at a predetermined angle with respect to the bottom 9b. Also the shutter member 11 should desirably have an inclined forward end face.

The memory card 1 has thus the inclined inner wall 9a parallel to the forward open end of the concavity 9 and the inclined forward end face of the shutter member 11 so that when the memory card 1 is inserted into the receptacle, dust or the like in the concavity 9 can easily be let out from on the inclined wall and end face.

Figure 6A:
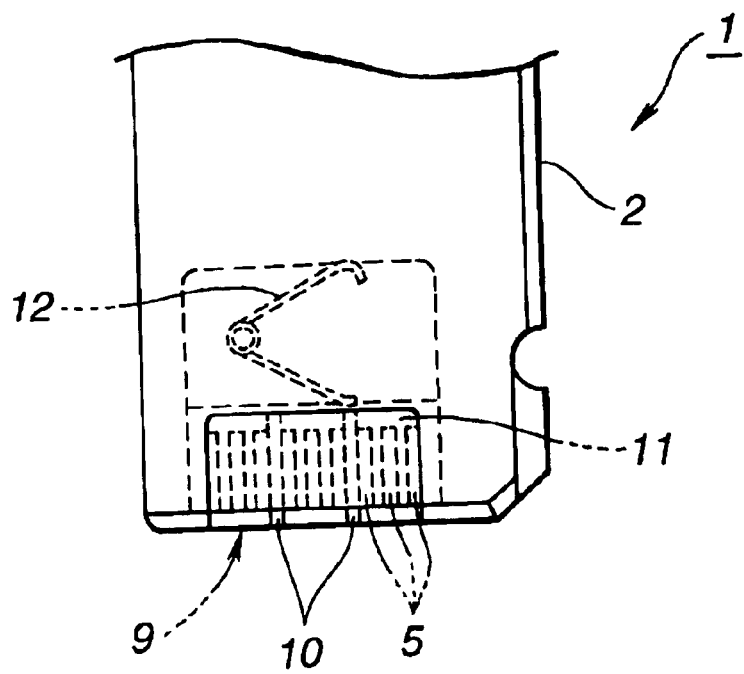
FIG. 6A is a plan view of a fifth embodiment of the memory card according to the present invention, showing the essential portion thereof with a shutter member placed to close the concavity.
Figure 6B:
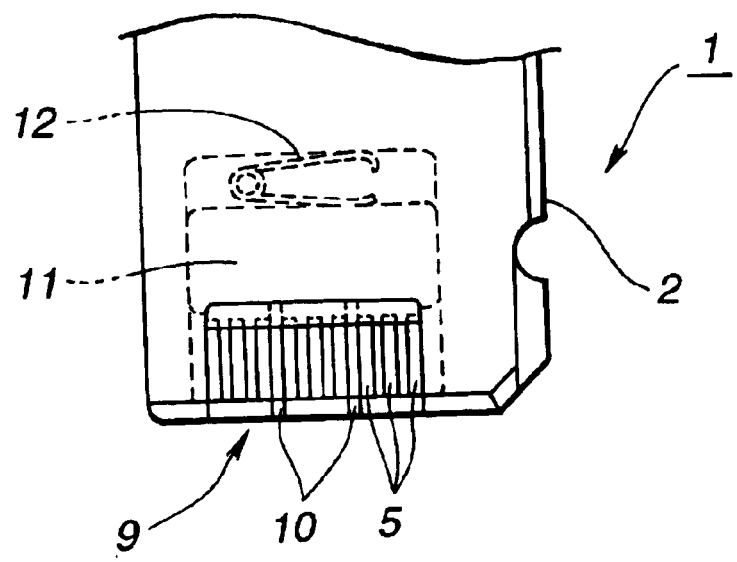
FIG. 6B is a plan view of the memory card in FIG. 6A, showing the essential portion thereof with the shutter member placed to open the concavity.

Also in this memory card 1, the projections 10 may be formed inside the concavity 9 to define sockets for the terminals 5 as shown in FIGS. 6A and 6B. Thus, the projections 10 can positively protect the terminals 5 by preventing touch to them even when the shutter member 11 is inadvertently opened with the memory card 1 not yet inserted into the receptacle. FIG. 6A shows the top opening of the concavity 9 being covered or closed by the shutter member 11 while FIG. 6B shows the shutter member 11 moved away from on the concavity 9 and thus the concavity 9 being open at the top thereof.

Figure 7:
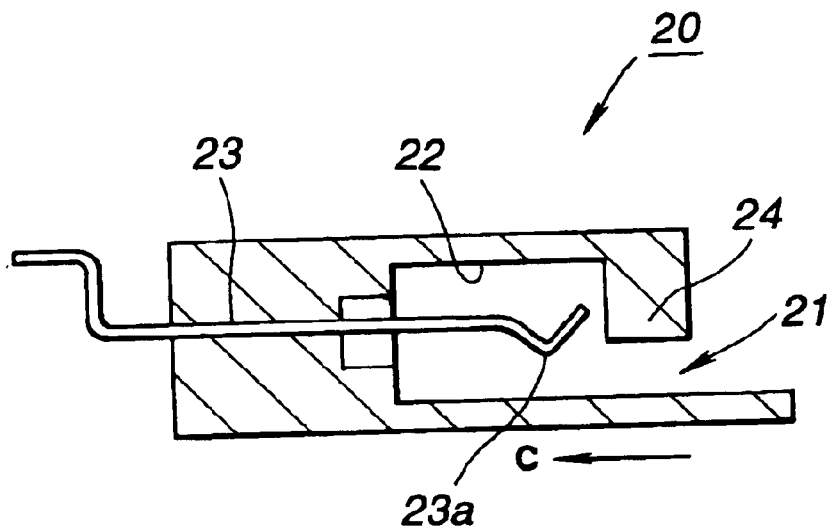
FIG. 7 is a sectional view of a first embodiment of the memory card receptacle according to the present invention.
Figure 8:
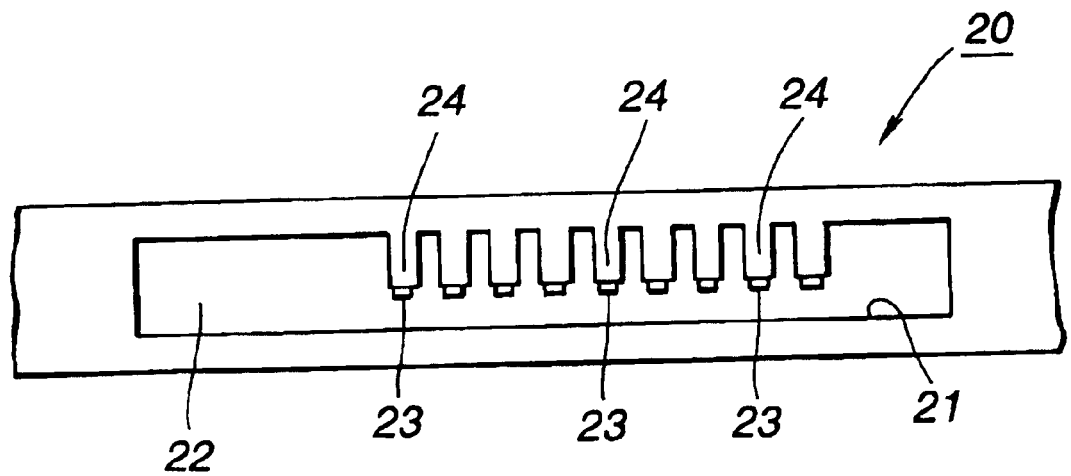
FIG. 8 is a front view of the memory card receptacle in FIG. 7.

FIGS. 7 and 8 show a memory card receptacle, generally indicated with a reference 20, adapted to receive the memory card 1 having been described in the foregoing. When the memory card 1 constructed as in the above is used, it is inserted in the receptacle 20 as shown in FIGS. 7 and 8 to record or reproduce information signal into or from the memory card 1.

As shown, the memory card receptacle 20 has an opening 21 formed at the front end thereof, through which the memory card 1 is inserted into the receptacle 20. Also, the receptacle 20 has formed therein, in the inserting direction of the memory card 1 indicated with an arrow C in FIG. 7, a memory card receiving concavity 22 axially extending from the opening 21 to a depth in the receptacle 20 and in which the memory card 1 is received. There are disposed inside this memory card receiving concavity 22 tips of a plurality of terminals 23 electrically connected to an external system as shown in FIG. 7.

The terminals tips 23 are formed by punching a thin metal sheet, for example. The terminals 23 are supported with the bases thereof buried in the body of the receptacle 20 as shown. Therefore, the terminals 23 also work as leaf springs which depress the terminals 5 of the memory card 1 inserted in the receptacle 20. The terminals 23 have each a contact point 23a formed near the free ends thereof inside the receiving concavity 22 and which are put into contact with the terminals 5 of the memory card 1.

The terminals 23 of the receptacle 20 are equal in number to the terminals 5 of the memory card 1. In this embodiment of the receptacle 20, nine terminals 23 for the nine terminals 5 of the memory card 1 are provided in the receiving concavity 22.

Figure 9:
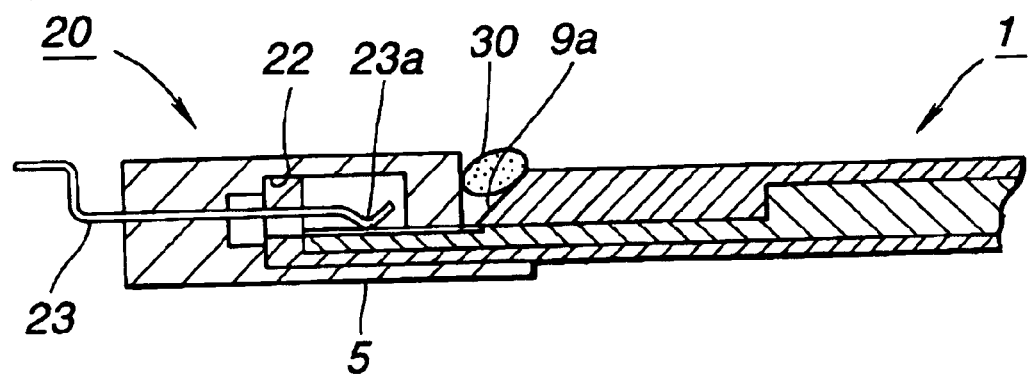
FIG. 9 is a sectional view of the receptacle in FIG. 7 in which the memory card is received.

Further, there are provided ahead of the terminals 23 disposed in the receiving concavity 22, that is to say, in positions corresponding to the forward end of the memory card 1 when inserted in the receptacle 20, projections 24 which will slide on the terminals 5 of the memory card 1 when the latter is inserted into the receptacle 20. The projections 24 are equal in number to the terminals 5 of the memory card 1 similarly to the terminals 23 of the receptacle 20. The projections 24 are provided ahead of the terminals 23. In this embodiment of the receptacle 20, nine projections 24 are thus provided for the nine terminals 5. When the memory card 1 is inserted into the receptacle 20, the projections 24 slide on the terminals 5 of the memory card 1 before they get into contact with the terminals 23 as shown in FIG. 9. The projections 24 will let out dust or the like from inside the concavity 9 of the memory card 1 over the inclined wall 9a of the concavity 9 of the memory card 1.

When the memory card 1 is inserted into the memory card receptacle 20, the projections 24 move ahead of the terminals 23 and slide on the terminals 5 of the memory card 1. After the projections 24 let out dust or the like from on the terminals 5, the terminals 23 get into contact with the terminals 5 of the memory card 1. Thus, the terminals 23 and 5 are electrically connected to one another in a positive manner.

In the receptacle 20, the plurality of projections 24 is provided ahead of the terminals 23 correspondingly to the terminals 5, respectively, of the memory card 1 in such a manner that the projections 24 can be well fitted into the sockets defined by the projections 10 inside the concavity 9 of the memory card 1 for the respective terminals 5. Thus, the receptacle 20 can suitably receive the memory card 1 of such a structure as well as the memory card 1 having the concavity 9 of which the space is similarly trisected by the projections 10.

Figure 10:
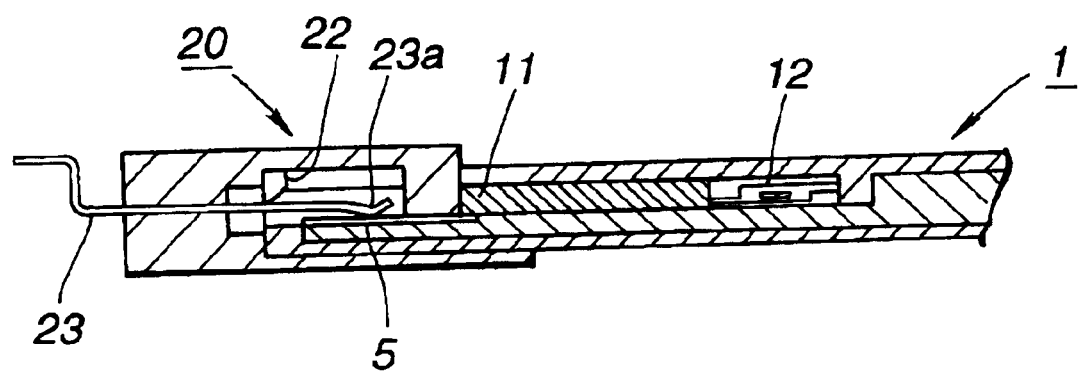
FIG. 10 is a sectional view of the receptacle in FIG. 7 in which another memory card of the present invention is received.

Further, the receptacle 20 can well receive the memory card 1 having the concavity 9 of which the top opening can be covered by the shutter member 11 for protection of the terminals 5. In this example, when the memory card 1 having the shutter member 11 is inserted into the receptacle 20, the projections 24 abut at the front end faces thereof on the forward end of the shutter member 11 which will thus be moved open as the memory card 1 is further inserted into the receptacle 20, as seen from FIG. 10.

Figure 11:
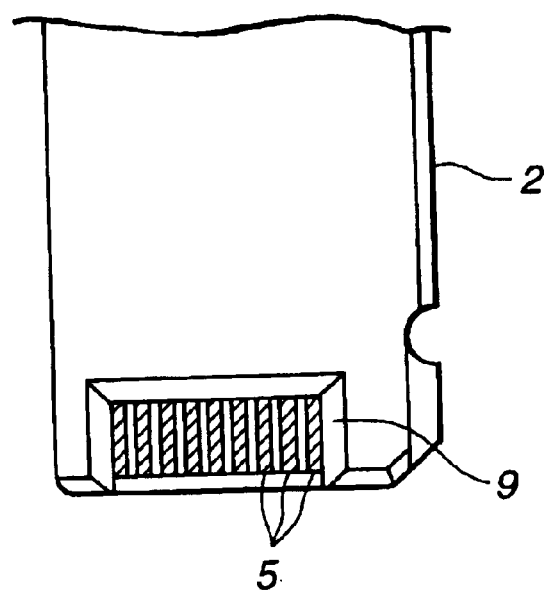
FIG. 11 is a plan view showing the essential portion of another memory card of the present invention.

Also it is of course that the receptacle 20 can receive a memory card having only the concavity 9 formed at the forward end, in the inserting direction, of the card body 2, and the terminals 5 disposed in the concavity 9, as shown in FIG. 11, with the projections 10 and shutter member 11 not provided.

The memory card receptacle 20 is versatile as having been described in the above, namely, it can be universally applied without being restricted by the shape of the memory card 1

Figure 12:
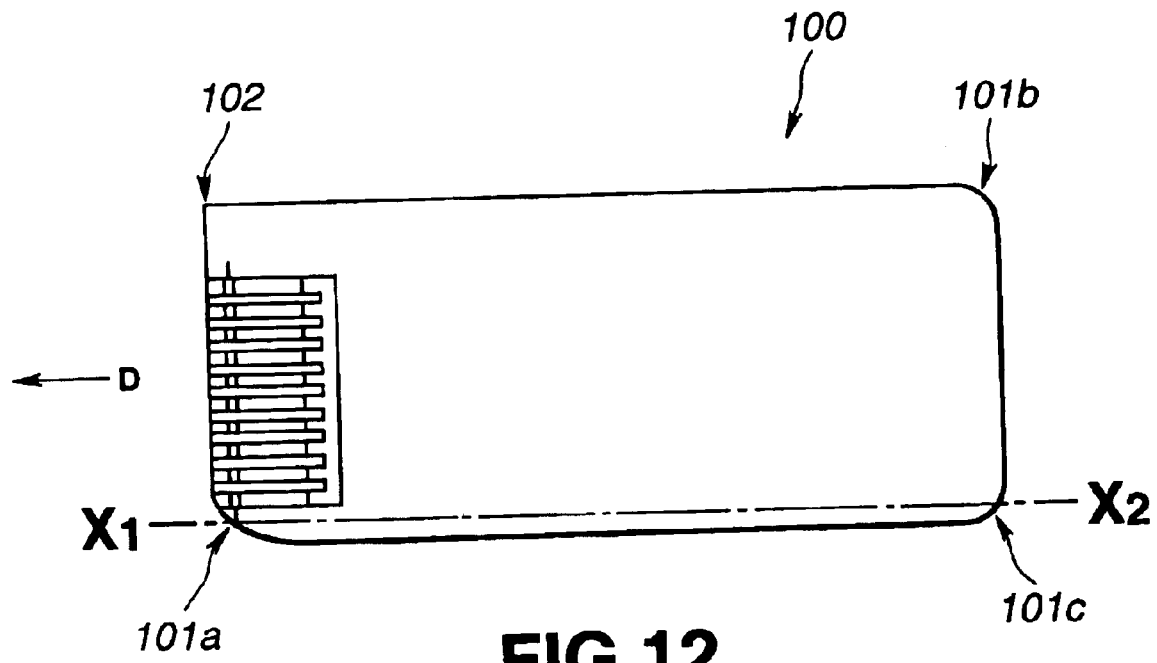
FIG. 12 is a plan view showing an example of the shape of the memory card of the present invention.
Figure 13:
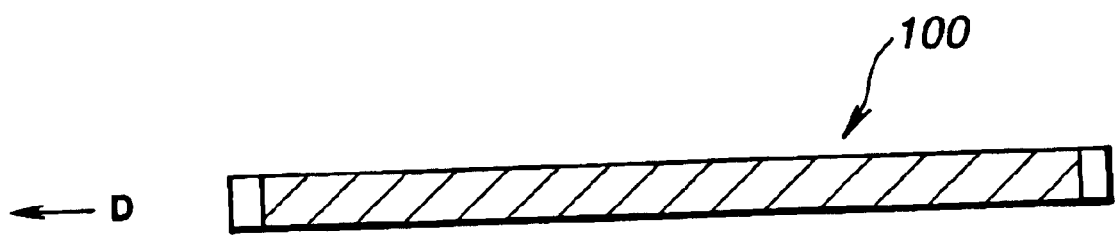
FIG. 13 is a sectional view taken along the line $X_1$–$X_2$ of the memory card in FIG. 12.

It should now be noted that the memory card according to the present invention may also be constructed as will be discussed below:

FIG. 12 is a plan view of an example of the memory card, and FIG. 13 is a sectional view taken along the line $X_1$–$X_2$ of the memory card in FIG. 12.

The memory card is generally indicated with a reference 100. It has a generally rectangular flat shape having four corners 101a, 101b, 101c and 102. Of these four corners, one (101a) of the corners at the forward end, in the inserting direction, of the memory card 100 indicated with the arrow D, and both the corners 101b and 110c at the rear end, in the inserting direction of, the memory card 100 indicated with the arrow D, are chamfered much more than the remaining corner, or the latter is not chamfered. Namely, the memory card 100 is so shaped that it can be judged based on the position of the corner 102 whether the memory card 100 being inserted into the receptacle is positioned correctly or incorrectly, whereby the memory card 100 can be prevented from incorrectly being inserted into the receptacle.

As mentioned above, the remaining corner 102 at the forward end, in the inserting direction, of the memory card 100 indicated with the arrow D is not chamfered while the other three corners 101a, 101b and 101c are chamfered to have an arcuate form, for example. Furthermore, the corner 101a is rounded much more than the other two corners 101b and 101c as shown in FIG. 12.

Figure 14:
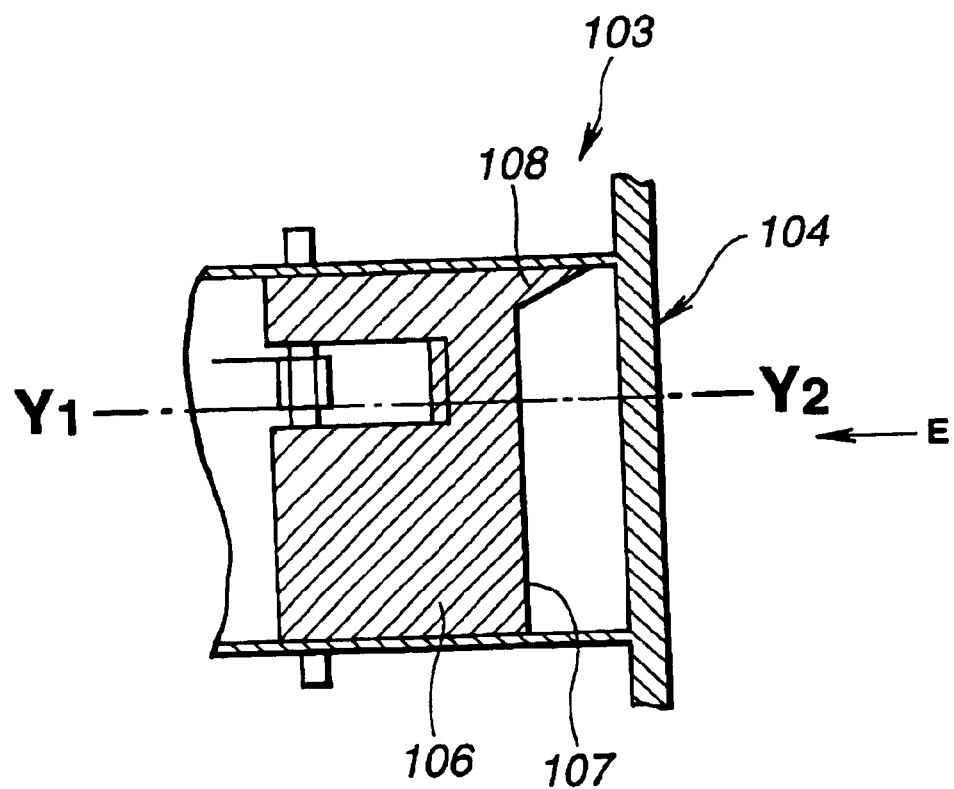
FIG. 14 is a plan view showing an example of the construction of the receptacle of the present invention in which the memory card of the present invention is received.
Figure 15:
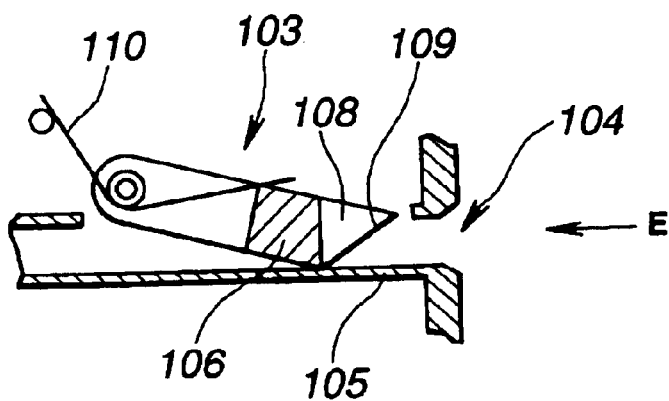
FIG. 15 is a sectional view taken along the line $Y_1$–$Y_2$ in FIG. 14, showing the example of the construction of the receptacle of the present invention.

When used for information recording or reproduction, the memory card 100 is inserted into a receptacle 103 as shown in FIGS. 14 and 15. FIG. 14 is a plan view of an example of the receptacle 103, and FIG. 15 is a sectional view taken along the line $Y_1$–$Y_2$ of the receptacle 103 in FIG. 14. Although FIG. 14 is a plan view, hatching is made somewhere therein for better understanding of the relation between the members of the receptacle 103.

The receptacle 103 has formed at the forward end thereof an opening 104 through which the memory card 100 is to be inserted, formed therein a receiving concavity 105 extending from the opening 104 along the inserting direction of the memory card 100 indicated with an arrow E, and provided at the innermost portion of the opening 104 an incorrect insertion-preventive member 106 extending in the inserting direction of the memory card 100 indicated with the arrow E.

The incorrect insertion-preventive member 106 has at the opening 104 of the receptacle 103 a front end face 107 extending generally perpendicular to the inserting direction of the memory card 100, and a projection 108 formed at one of the lateral ends of the front end face 107. The projection 108 has an oblique surface 109 which becomes thinner and narrower as it goes from the front end face 107 toward the opening 104. The oblique surface 109 detects the corner 102 of the memory card 100.

Further the incorrect insertion-preventive member 106 is pivoted and forced clockwise in the plane of FIG. 15 under the action of a coil spring 110. When the receptacle 103 is not used, the member 106 closes the opening 104 to block dust or the like from coming into the receptacle 103.

Figure 16:
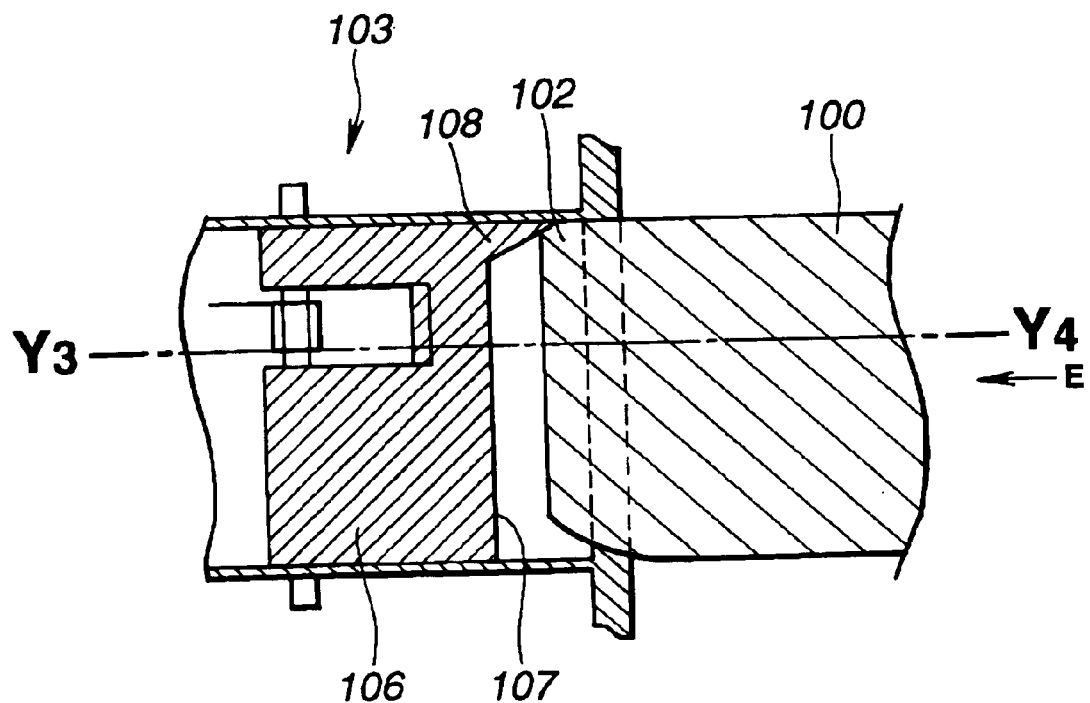
FIG. 16 is a plan view showing the memory card being correctly inserted in the receptacle.
Figure 17:
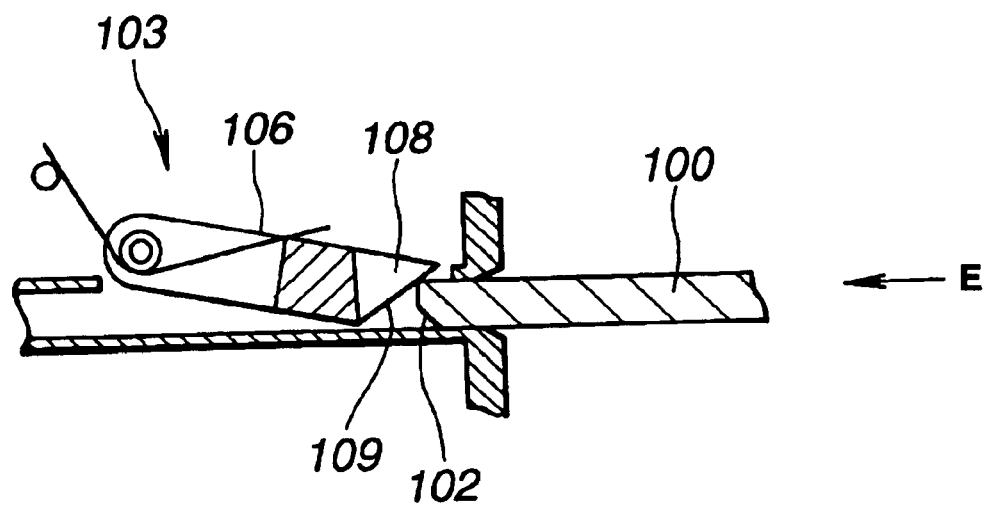
FIG. 17 is a sectional view taken along the line $Y_3$–$Y_4$ in FIG. 16, showing the memory card being correctly inserted in the receptacle.
Figure 18:
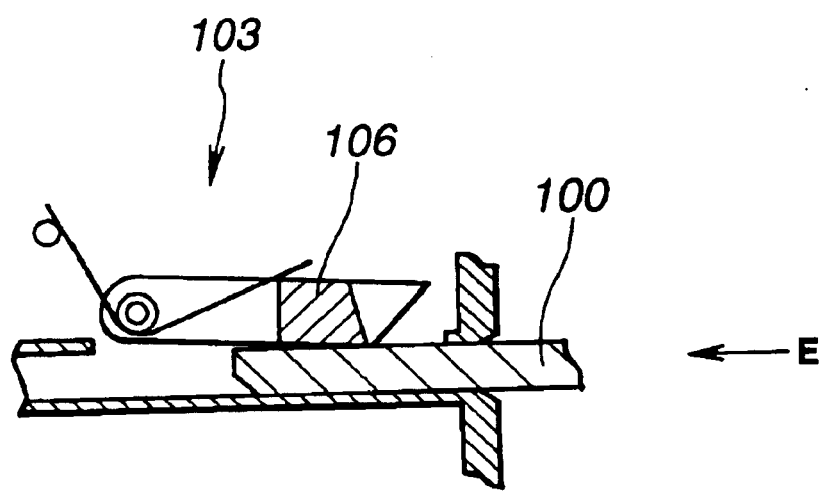
FIG. 18 is also a sectional view taken along the line $Y_3$–$Y_4$ in FIG. 16, showing the memory card correctly inserted in the receptacle.

FIGS. 16, 17 and 18 show the memory card 100 correctly inserted in the receptacle 103. As the memory card 100 is inserted from the opening 104 in the direction of arrow E, it will abut at the corner 102 thereof on the projection 108 formed on the incorrect insertion-preventive member 106 as shown in FIG. 16. Then the upper end of the corner 102 slides on the oblique surface 109 of the projection 108 as shown in FIG. 17 and urges up the incorrect insertion-preventive member 106. Eventually the corner 102 will allow the incorrect insertion-preventive member 106 to escape as shown in FIG. 18 and thus the memory card 100 is allowed to go into place in the receptacle 103.

Figure 19:
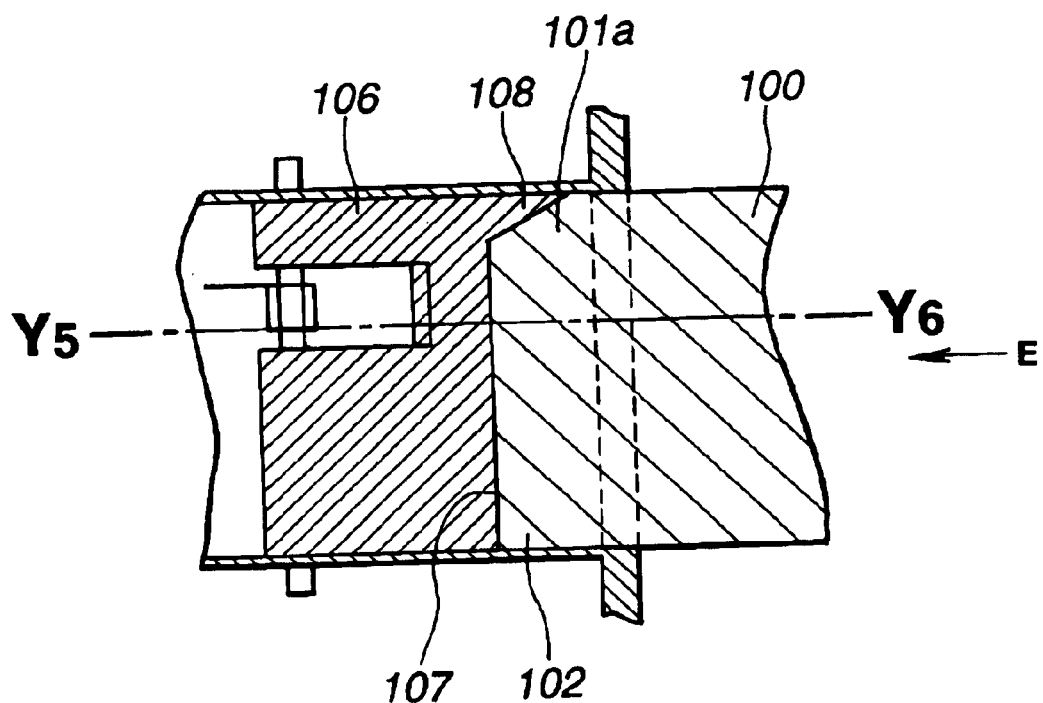
FIG. 19 is a plan view showing the memory card being incorrectly inserted into the receptacle.
Figure 20:
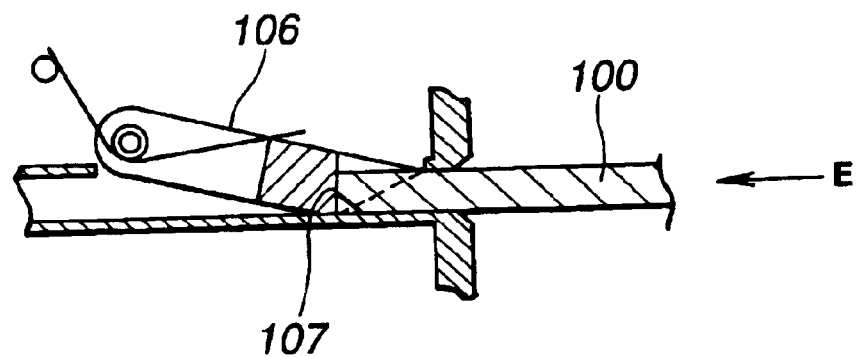
FIG. 20 is a sectional view taken along the line $Y_5$–$Y_6$ in FIG. 19, showing the memory card being incorrectly inserted into the receptacle.

FIGS. 19 and 20 show the memory card 100 being inserted in a wrong direction into the receptacle 103. As the memory card 100 is inserted in the direction of arrow E, the rounded corner 101*a* will not abut on the projection 108 of the incorrect insertion-preventive member 106 but at the forward end, in the inserting direction, thereof on the front end face 107 of the incorrect insertion-preventive member 106. Since the front end face 107 of the member 106 is formed generally perpendicular to the inserting direction of the memory card 100 indicated with the arrow E, the forward end of the memory card 100 will be caught by the projection 108 and thus cannot urge up the incorrect insertion-preventive member 106. Therefore, if the memory card 100 is incorrectly inserted into the receptacle 103, the corner 101*a* will not allow the incorrect insertion-preventive member 106 to escape, so that the memory card 100 cannot be inserted deep into place in the receptacle 103.

FIGS. 19 and 20 show an example in which the memory card 100 is inserted upside down in the receptacle 103. Also in this case, the corners 101*b* and 101*c* will not allow the incorrect insertion-preventive member 106 to escape, so that the memory card 100 cannot be inserted deep into place in the receptacle 103. Therefore, it is only when the memory card 100 is inserted correctly that the memory card 100 can be inserted deep into place in the receptacle 103. Thus, the memory card 100 can be prevented from being incorrectly inserted into the receptacle 103.

Figure 21:
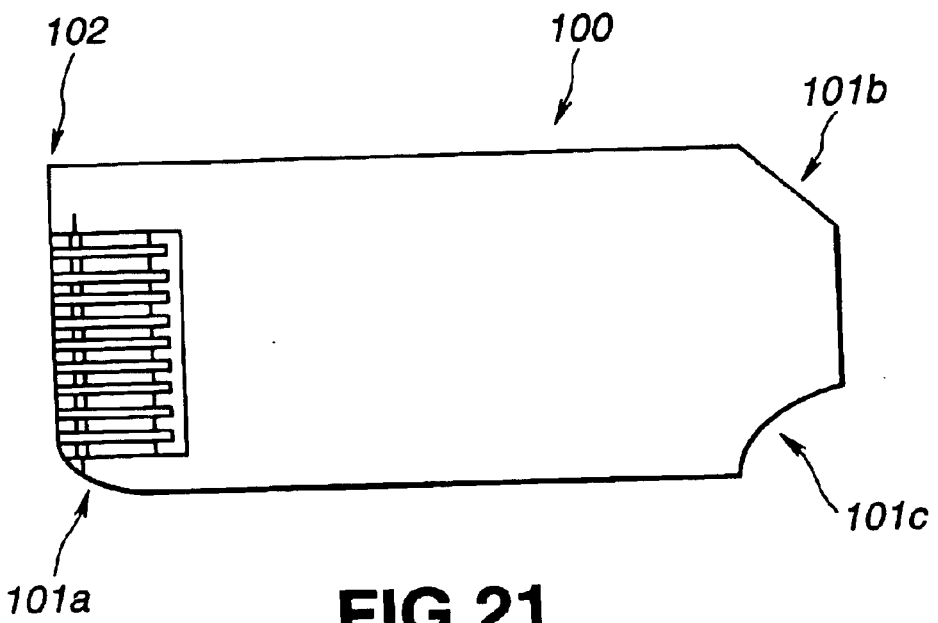
FIG. 21 is a plan view showing an example of the shape of the memory card of the present invention.

For the purpose of preventing an incorrect insertion of the memory card 100, the corners 101*a*, 101*b* and 101*c* have only to be formed not to abut on the projection 108 of the incorrect insertion-preventive member 106, and thus may be shaped to have any flat form. For example, the corners may be chamfered in different sizes as well as in various shapes such as arcuate, linear or the like as shown in FIG. 21. Such variations in chamfered size and shape of the corners will also give a variation to the memory card design.

Figure 22:
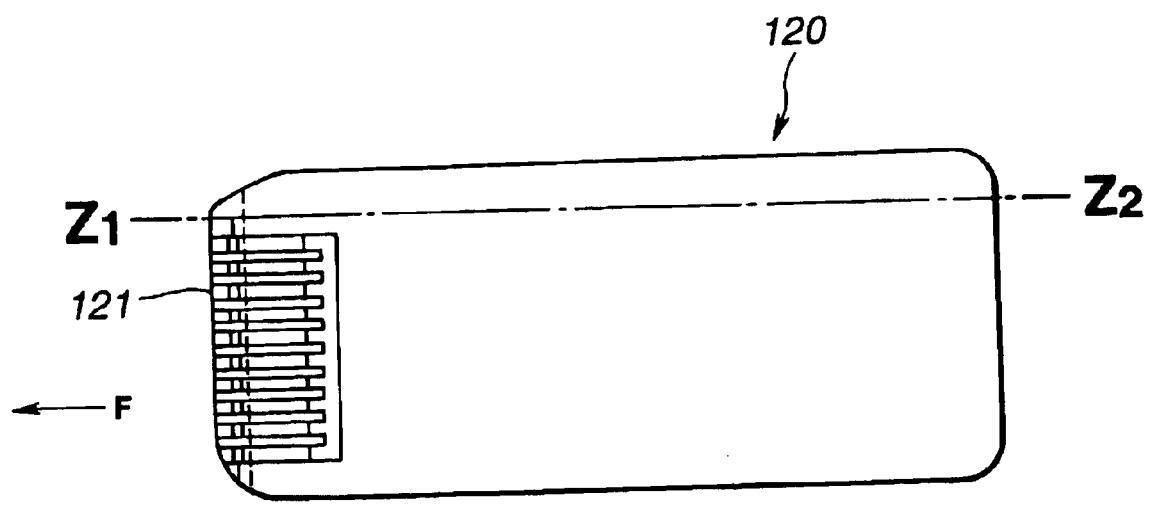
FIG. 22 is a plan view showing an example of the shape of the memory card of the present invention.
Figure 23:
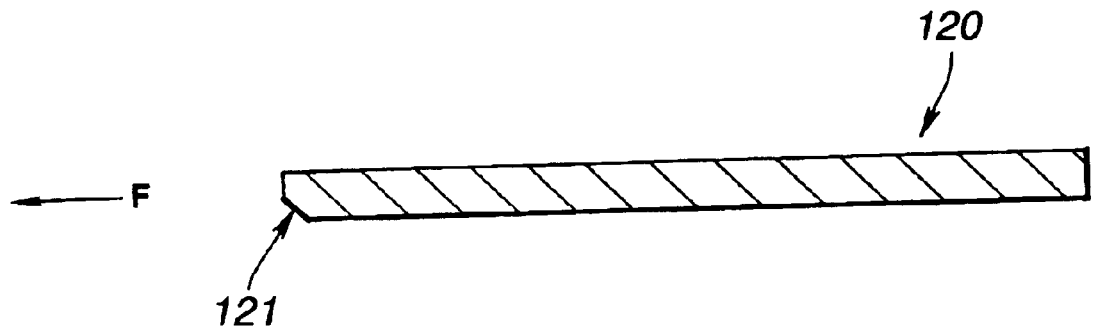
FIG. 23 is a sectional view of the memory card, taken along the line $Z_1$–$Z_2$ in FIG. 22.

Also it should be noted that the memory card according to the present invention may be constructed as will be discussed below:

FIG. 22 shows, in the form of a plan view, an example of the memory card, and FIG. 23 is a sectional view taken along the line $Z_1$–$Z_2$ of the memory card shown in FIG. 22.

This memory card 120 is generally rectangular in shape, and cut at 121 at the bottom edge of the forward end thereof in the inserting direction indicated with an arrow F as will be seen from FIG. 23. The cut 121 extends over the entire forward-end short side of the memory card 120, and provides an oblique flat end face.

For preventing incorrect insertion of the memory card 120, it is judged based on the position of this cut 121 whether the memory card 120 is inserted correctly or incorrectly, as will be discussed below.

Figure 24:
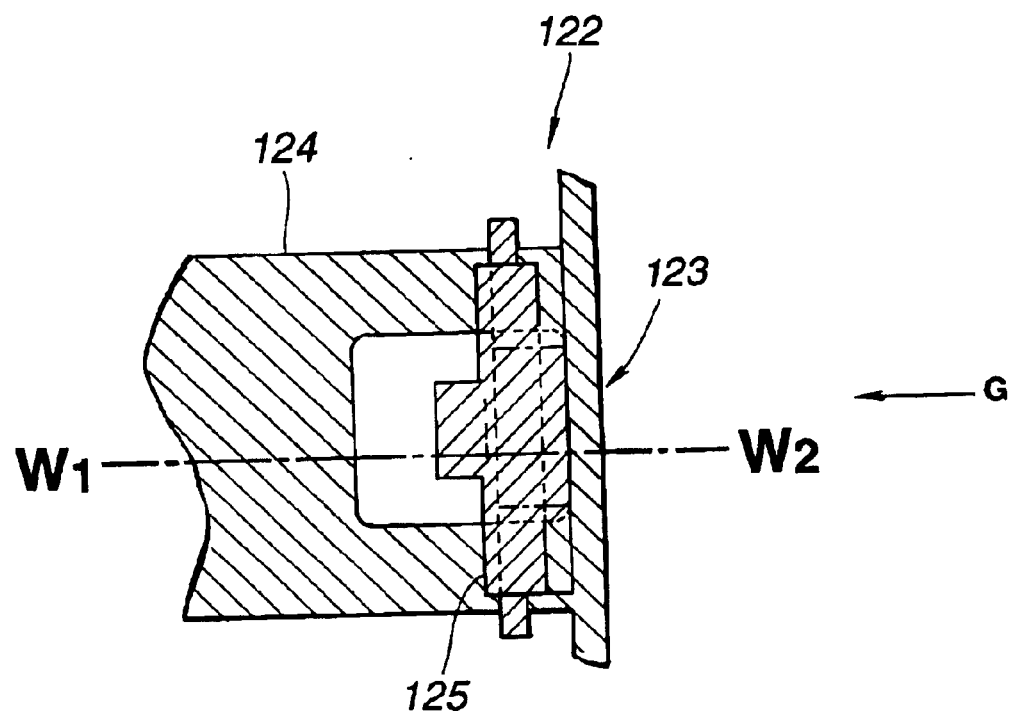
FIG. 24 is a plan view showing an example of the construction of the receptacle of the present invention in which the memory card of the present invention is inserted.
Figure 25:
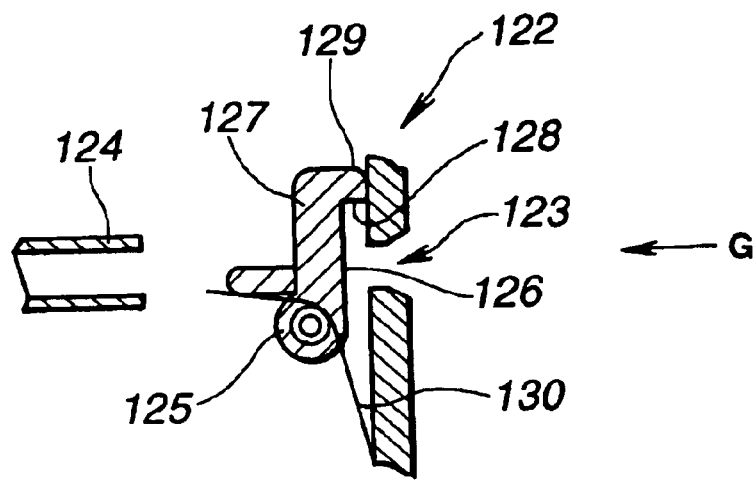
FIG. 25 is a sectional view of the receptacle, taken along the line WI–W2 in FIG. 24.

For information recording or reproduction, the memory card 120 is inserted into place in a receptacle 122 as shown in FIGS. 24 and 25. FIG. 24 is a plan view of an example of the construction of the receptacle 122, and FIG. 25 is a sectional view taken along the line $W_1$–$W_2$ of the receptacle 122 shown in FIG. 24. The receptacle 122 has formed at the forward end thereof an opening 123 through which the memory card 120 is to be inserted, formed therein a receiving concavity 124 extending from the opening 123 in the inserting direction of the memory card 120 indicated with an arrow G, and provided at the innermost portion of the opening 123 an incorrect insertion-preventive member 125 extending in the inserting direction of the memory card 120 indicated with the arrow G.

As shown in FIG. 25, the incorrect insertion-preventive member 125 has a blocking plate 127 having a first face 126 generally perpendicular to the inserting direction of the memory card 120 indicated with the arrow G, and a projection 129 provided at the upper end of the blocking plate 127 on the side of the opening 123 and which has a second face 128 generally parallel to the inserting direction of the memory card 120.

Further the incorrect insertion-preventive member 125 is pivoted and forced clockwise in the plane of FIG. 25 under the action of a coil spring 130. When the receptacle 122 is not used, the member 125 closes the opening 123 to block dust or the like from coming into the receptacle 122.

As the memory card 120 is inserted into the receptacle 122, the incorrect insertion-preventive member 125 is rotated about 90° counterclockwise (in the plane of Figure) against the action of the coil spring 130 and the first face 126 will be generally parallel to the inserting direction of the memory card 120.

Figure 26:
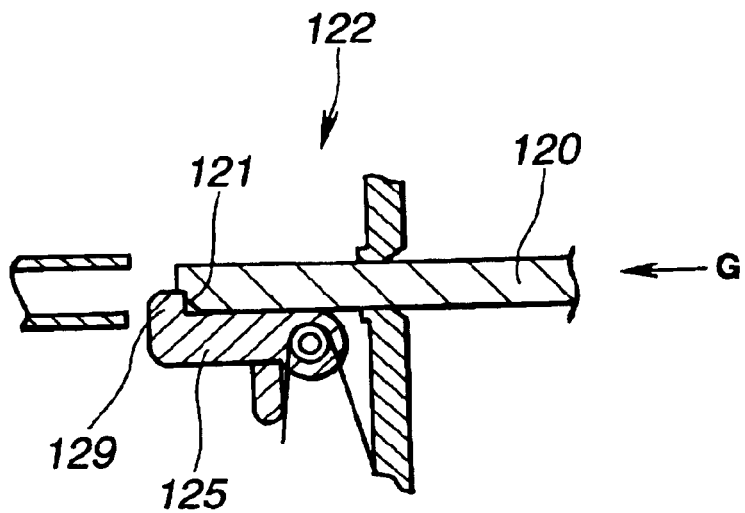
FIG. 26 is a sectional view showing the memory card being correctly inserted in the receptacle.
Figure 27:
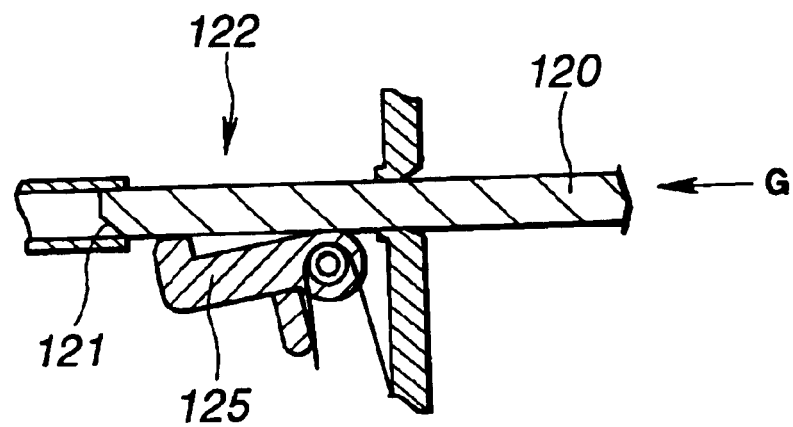
FIG. 27 is also a sectional view showing the memory card being correctly inserted in the receptacle.

When the memory card 120 is correctly inserted into the receptacle 122, that is to say, when the cut 121 formed at the bottom edge of the forward end of the memory card 120 is positioned down, the forward end of the memory card 120 will slide at the oblique face of the cut 121 onto the projection 129 to depress the incorrect insertion-preventive member 125, as shown in FIG. 26. Thus, the cut 121 will allow the incorrect insertion-preventive member 106 to escape as shown in FIG. 27 and thus the memory card 120 is allowed to go deep into place in the receptacle 122.

Figure 28:
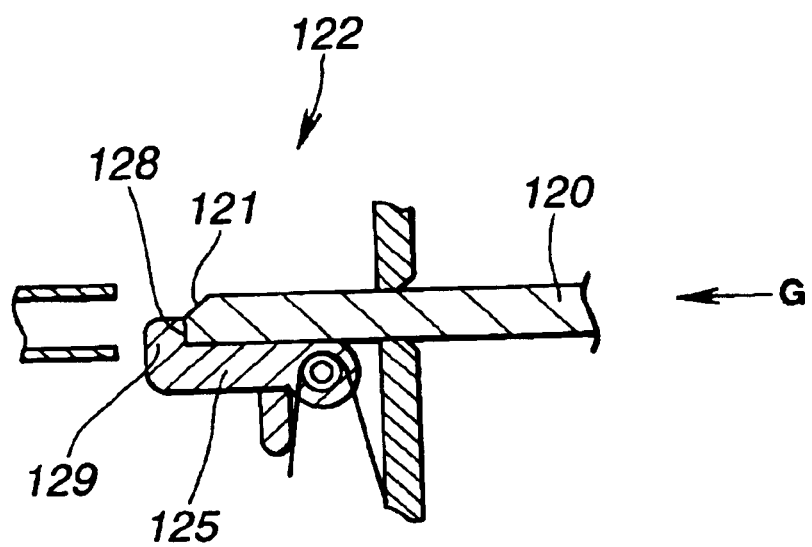
FIG. 28 is a sectional view showing the memory card being incorrectly inserted into the receptacle.

When the memory card 120 is inserted in a wrong direction into the receptacle 122, that is, when the cut 121 is not positioned down as shown in FIG. 28, the memory card 120 will abut at the forward end thereof onto the second face 128 of the projection 129. Since the second face 128 is generally perpendicular to the inserting direction of the memory card 120 indicated with the arrow G, the forward end of the memory card 120 is caught by the projection 129 so that it cannot depress the incorrect insertion-preventive member 125. Therefore, when the memory card 120 is inserted in a wrong direction, the incorrect insertion-preventive member 125 cannot be allowed to escape to insert the memory card 120 deep into place in the receptacle 122.

FIG. 28 shows the memory card 120 being inserted upside down into the receptacle 122. Also when the memory card 120 is inserted in a reverse direction, the incorrect insertion-preventive member 125 cannot be allowed to escape to insert the memory card 120 deep into place in the receptacle 122. Therefore it is only when the memory card 120 is inserted correctly that it can be inserted deep into place in the receptacle 122. Thus, it is possible to prevent incorrect insertion of the memory card 120.

Figure 29:
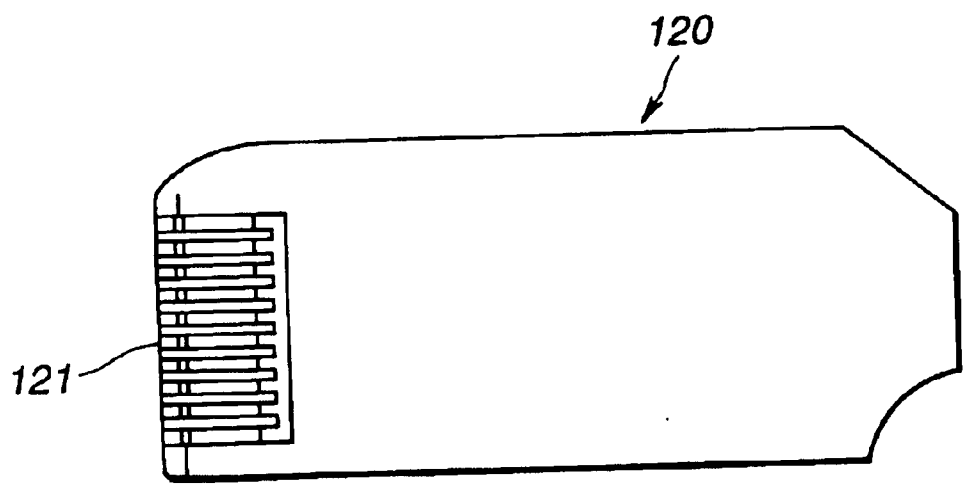
FIG. 29 is a plan view showing an example of the shape of the memory card of the present invention.

Since it is judged based on the shape in the direction of the width of the memory card 120 whether the memory card 120 is inserted correctly or incorrectly, the cut 121 has only to be formed to a size over which the projection 129 can be slid to depress the incorrect insertion-preventive member 125. Therefore, for the purpose of preventing an incorrect insertion of the memory card 120, the corners thereof has only to be shaped to have any flat form. For example, the memory card 120 may be chamfered at the corners thereof in different sizes as well as in various shapes such as arcuate, linear or the like, as shown in FIG. 29. Such variations in chamfered size and shape of the corners will also give a variation to the memory card design.

Figure 30:
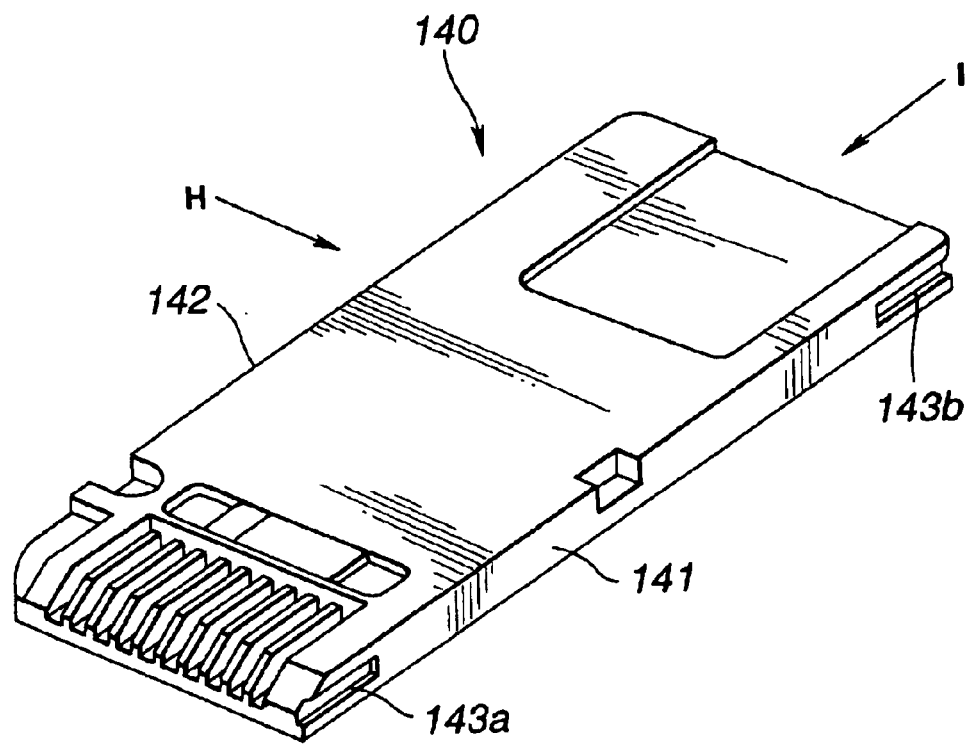
FIG. 30 is a perspective view showing an example of the shape of the memory card of the present invention.
Figure 31:
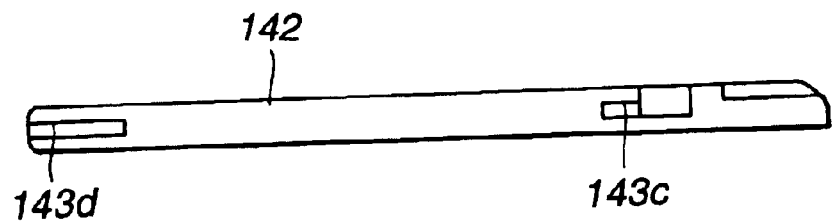
FIG. 31 is a view of the memory card from a point H in FIG. 30.
Figure 32:
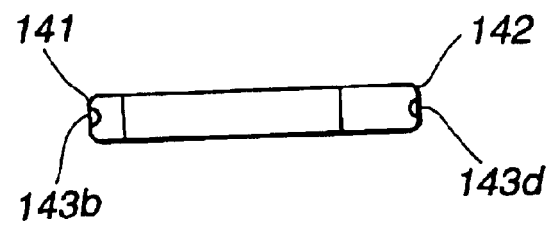
FIG. 32 is a view of the memory card from a point I in FIG. 30.

In addition to the above-mentioned structure designed for insertion into the receptacle, the memory card according to the present invention may be designed for fitting onto the top of the receptacle FIG. 30 shows an example of the memory card of such design. In this case, the memory card is generally indicated with a reference 140. FIG. 31 is a view of the memory card 140 from a direction H in FIG. 30, and FIG. 32 is a view of the memory card 140 from a direction I in FIG. 30. The memory card 140 has a generally rectangular flat shape. Also the memory card 140 has recesses 143a and 143b formed at end portions, respectively, of a first longitudinal side 141 thereof and also recesses 143c and 143d formed at end portions, respectively, of a second longitudinal side 142 parallel to the first longitudinal side, as shown in FIG. 31.

The memory card 140 can be fitted into a receptacle 144 using the recesses 143a to 143d thereof as will be described below.

Figure 33:
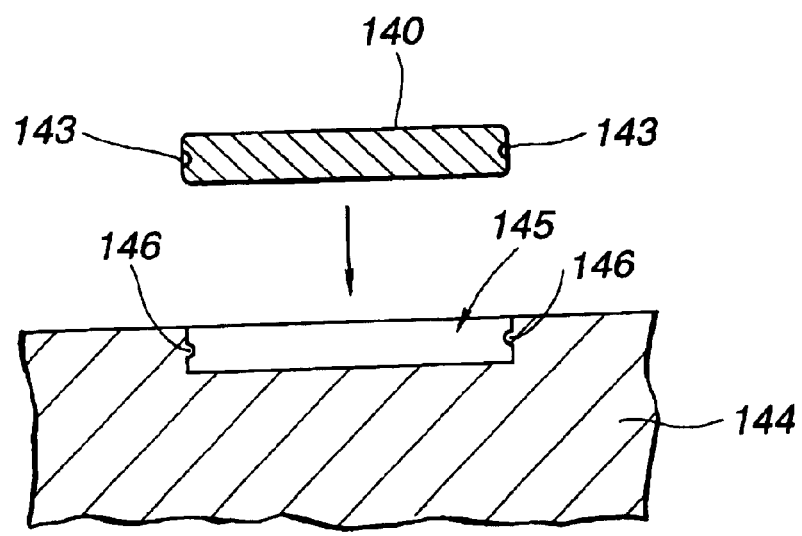
FIG. 33 is a sectional view of the memory card of the present invention inserted in the receptacle of the present invention.
Figure 34:
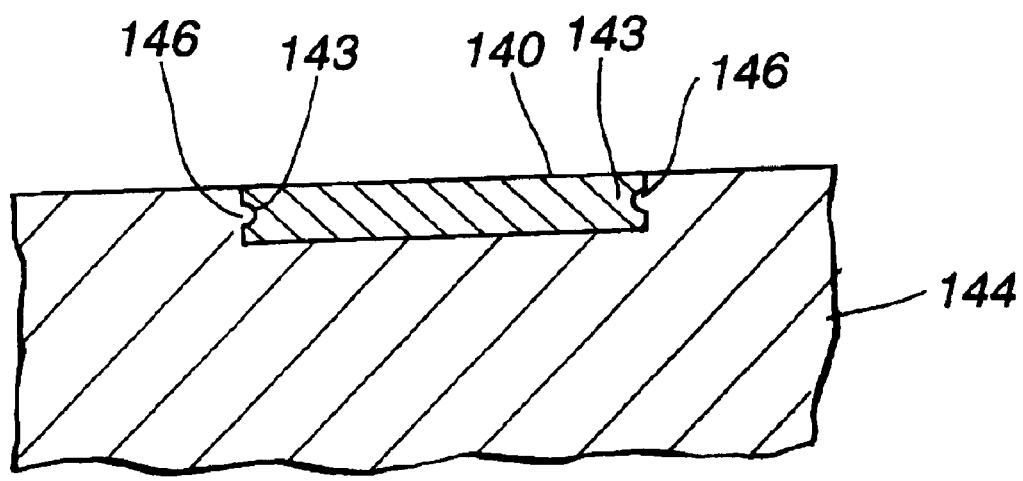
FIG. 34 is a sectional view of the memory card of the present invention inserted in the receptacle of the present invention.

As shown in FIG. 33, the receptacle 144 has formed on the top thereof a concavity 145, for example, in which the memory card 140 is to be fitted. The concavity 145 is open at the top thereof, and projections 146 are formed on side walls, respectively, of the concavity 145. For example, the memory card 140 can be fitted to the receptacle 144 with the projections 146 of the receptacle 144 engaged in the recesses 143 (143a to 143d) of the memory card 140, as shown in FIG. 34.

The memory card 140 can be directly set in a recording/reproducing apparatus. Also, the memory card 140 may be fitted in an adapter having a shape of a flexible disk, PC card or the like, for example, and then the adapter in which the memory card 140 is fitted be set in the recording/reproducing apparatus.

In this case, since the memory card is fitted in a receptacle and then set in the recording/reproducing apparatus, the top cover of the receptacle is unnecessary and the receptacle can be designed thinner than a one which is to receive the memory card therein so that the receptacle can be designed more compact. Also, the above-mentioned adapter destined to have the memory card fitted therein for setting into a recording/reproducing apparatus can be designed to have a reduced thickness.

Figure 35:
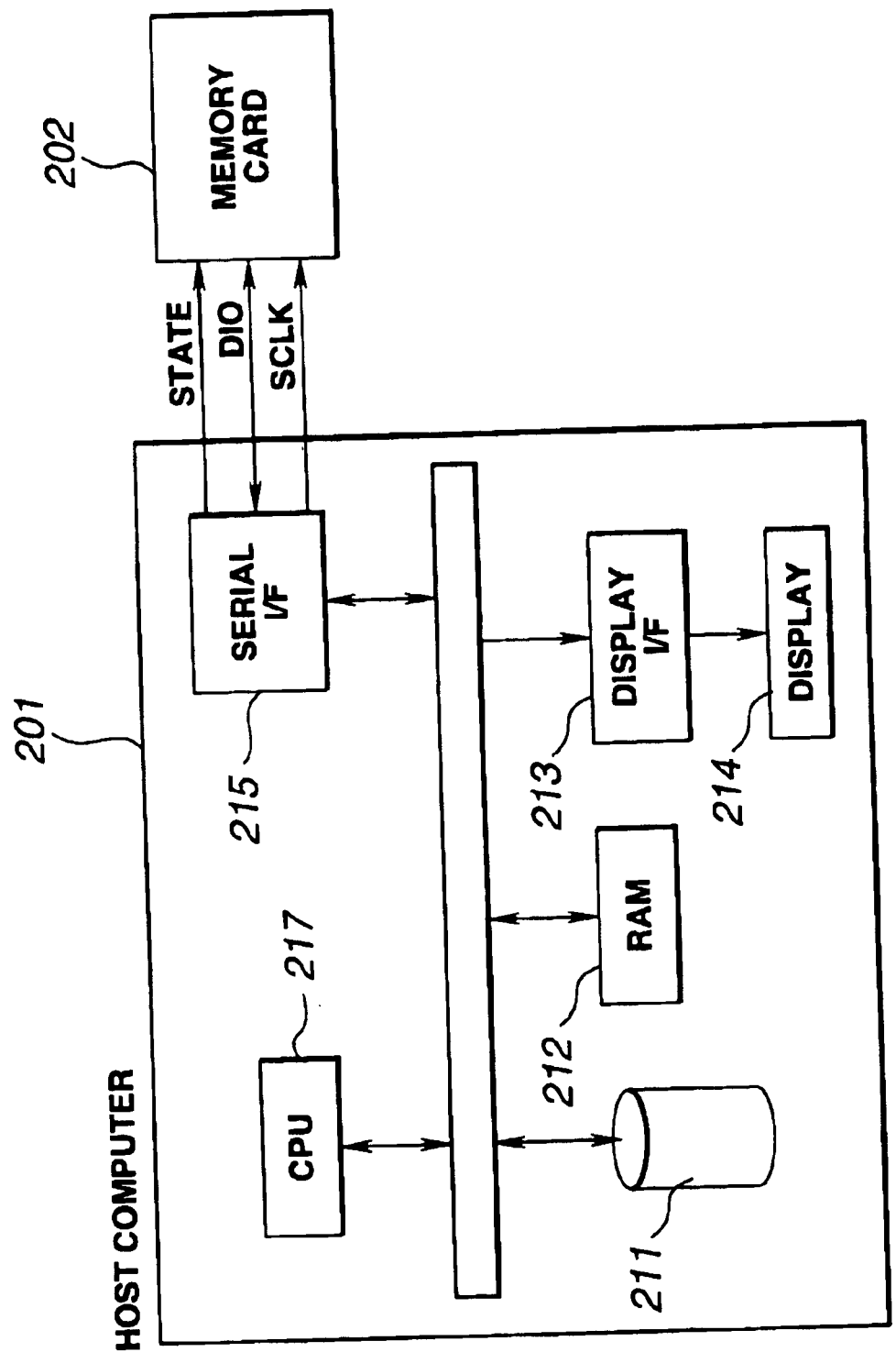
FIG. 35 is a block diagram showing a configuration of a host computer according to the present invention.

FIG. 35 shows the use of the memory card for storing data from a host computer. It should be noted that an embodiment will be explained for the case of writing video data transmitted from the host computer, on the memory card, but the present invention can also be applied to data other than video data such as audio data.

As shown in FIG. 35, the aforementioned host computer 201 includes: a hard disc 211 for storing various data such as video data of a still image data and audio data; a RAM (random access memory) 212 for temporarily storing and reading out the video data and other data from the hard disc 211; a display interface (hereinafter referred to as a display I/F) 213; a display 214 for displaying an image according to the video data supplied via the display interface 213; a serial interface (hereinafter, referred to as a serial I/F) 215 for transmitting and receiving data to/from a memory card 202 via three data lines; a bus 216; and a CPU (central processing unit) 217 for control.

The RAM 212, for example, temporarily stores video data stored in the hard disc 211 via the bus 216 and, when necessary, supplies the video data via the bus 216 to the serial I/F 215.

The display 214 is supplied via the bus 216 and the display I/F 213 with the video data which has been read out from the hard disc 211 or video data from the memory card 202, so that a still image or a moving picture is displayed according to the supplied video data.

The serial I/F transmits data to the memory card 202 or receives data stored in the memory card in serial form via the three data lines. More specifically, via a first data line, the serial I/F 215 transmits information data and control data for writing into the memory card 202 and receives information data read out from the memory card. Via a second data line, the serial I/F 215 outputs a state signal representing whether information data or control data is supplied via the first data line. Furthermore, via a third data line, the serial I/F 215 transmits a serial clock SCLK for transmission of the aforementioned control data and video data.

The CPU 217 controls reading out of information data from the RAM 212 and the hard disc 211 and writing information data into the RAM. The CPU also controls transmission and reception of information data to/from the memory card 202. For example, the CPU 217 issues a register instruction to detect whether an erase prevention switch (which will be detailed later) is in its ON state to prevent stored data from being erased or overwritten, and issues to the memory card 202 a write instruction for writing information data to an address.

Figure 36:
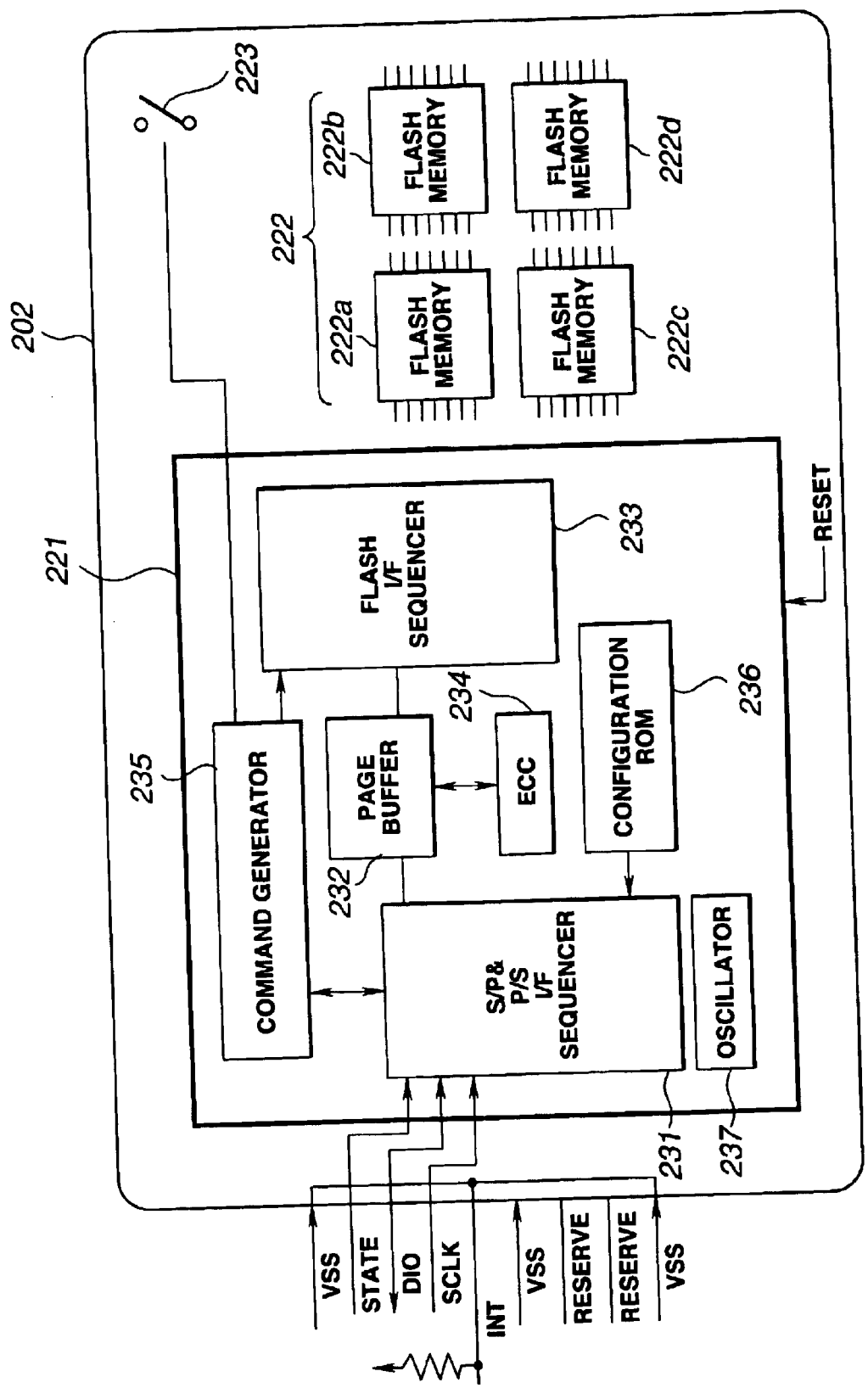
FIG. 36 is a block diagram showing a configuration of a memory card according to the present invention.

As shown in FIG. 36, the memory card 202 includes: a control IC 221 for receiving information data and control data from the aforementioned host computer 201; a flash memory 222 for storing the information data; and an erase prevention switch 223 for preventing erroneous erasure of the information data stored in the flash memory 222.

As described previously, the memory card is provided with the control IC 221, the flash memory 222, and the erase prevention switch 223. The erase prevention switch may be provided at one end of the memory card, as shown in FIGS. 3 and 4, or may be provided on a surface of the memory card as shown in FIG. 30. The erase prevention switch is slidable from side-to-side. When the erase prevention switch is set to one side, write protection (or erasure prevention) is in the OFF state and data can be recorded. When the erase prevention switch 223 is set to the other side, the user is provided with an observable indicia representing that write protection (or erasure prevention) is in the ON state; and the memory card 202 is disabled for recording data. Consequently, a user is provided with an indication of the state of the memory card, even when the memory card is placed in the receptacle described above.

The control IC 221, prior to writing data from the host computer 201 into the flash memory 222, detects whether the write protect state of the erase prevention switch 223 is ON or OFF. Data is written to the flash memory only when the write protect state is OFF.

Here, the control IC 221 includes: a serial/parallel-parallel/serial interface sequencer (hereinafter, referred to as an S/P & P/S sequencer) 213; a page buffer 232 for temporarily storing data from the SP & P/S sequencer; a flash interface sequencer (hereinafter, referred to as a flash I/F sequencer) 233 for supplying the data from the page buffer 232, to the flash memory 222; an ECC encoder/decoder 234 for carrying out error correction processing; a command generator 235 for generating a predetermined control command; a configuration ROM (read only memory) 236 containing version information as well as other information; and an oscillator 237 for supplying a clock to respective circuits.

The S/P & P/S sequencer 231 is connected via the aforementioned three data lines to the serial I/F 215 of the host computer 201. Thus, the SIP & P/S sequencer 231 is supplied from the host computer with a status signal and a serial clock SCLK as well as serial data DIO consisting of video data (or other information data as may be supplied form the host) and control data.

The SIP & P/S sequencer 231 converts the serial data DIO supplied from the host computer into parallel data in synchronization with the aforementioned serial clock SCLK. Among the parallel data, for example, the SIP & P/S sequencer 231 supplies control data to the command generator 235 and information data to the page buffer 232.

The page buffer is a buffer memory for storing the information data supplied from the S/P & P/S sequencer 231 on a page (=512 bytes) basis. An error correction code produced by the ECC encoder/decoder 234 is added to the data stored in the page buffer. The page buffer supplies one page of data (to which the error correction code has been added) via the flash I/F sequencer 233 to the flash memories 222a to 222d. Thus, the data from the host computer is written in the flash memories.

Similarly, the data read out from the flash memories is supplied via the flash I/F sequencer 233 to the page buffer 232 which stores such data. Here, the ECC encoder/decoder 234 carries out an error correction processing according to the error correction code added to the data stored in the page buffer 232. The error corrected data is read out from the page buffer page after page, and is supplied to the S/P & P/S sequencer 231. The S/P & P/S sequencer converts the parallel data supplied from the page buffer into serial data DIO for transmission to the host.

The command generator 235 generates a control command according to control data supplied from the S/P & P/S sequencer 231. For example, when the command generator receives a read status instruction (which is used to check the operation state of the memory card), the state of the erase prevention switch 223 is sensed and used to determine whether data should be written to the memory card.

The command generator 235 also generates a busy command (hereinafter, referred to as a busy signal) indicating that data is being written to the flash memory 222 or that data is being read from the flash memory. This busy command is supplied via the S/P & P/S sequencer 231 to the host. When the writing or reading of data is complete, the command generator generates a ready command (hereinafter, referred to as a ready signal) indicative thereof, and transmits the ready command via the S/P & P/S sequencer 231 to the host. The host recognizes the operation state of the memory card in response to the busy signal and the ready signal.

The configuration ROM 236 contains version information and information of an initial value of the memory card 202. When a connection is made between the host and the memory card, the command generator 235 first reads out the version information from the configuration ROM via the S/P & P/S sequencer and generates a predetermined command according to this information, thus executing predetermined initialization of the memory card.

Figure 37:
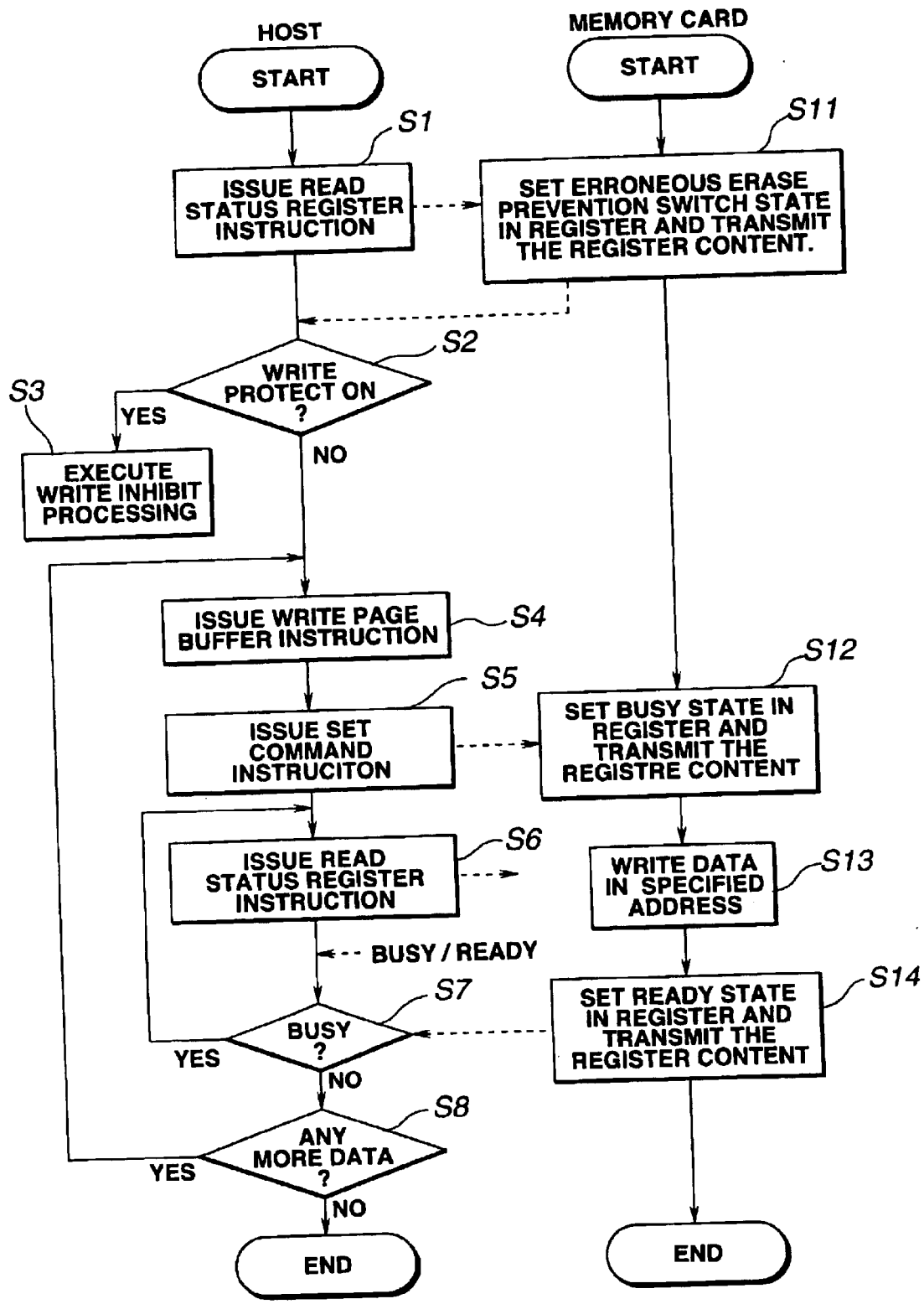
FIG. 37 is a flow chart which explains an operation procedure of a host and the memory card.

In the host and the memory card having the aforementioned configuration, when data from the host computer is written to the memory card as shown in FIG. 37, the host executes the operations of steps S1 to S8 while the memory card executes the operations of steps S11 to S14.

In the host, when data writing to the memory card is specified, the CPU 217 issues a read status instruction to check the state of the memory card (step S1) and transmits this instruction via the serial I/F 215 to the memory card. This read status instruction is issued for and in advance of each data file to be transmitted.

In the memory card, when the command generator 235 receives the aforementioned read status instruction via the S/P & P/S sequencer 231, the state of the erase prevention switch 223 is loaded to a register, and the contents of this register is transmitted via the S/P & P/S sequencer 231 to the host (step S11). In other words, the command generator detects whether the erase prevention switch is in its ON state, i.e., whether write protect of the memory card is ON, sets this state in the register and transmits the register content to the host.

In the host, CPU 217, the register content supplied from the memory card is used to determine whether write protect is ON (step S2) and, if so, the CPU 217 carries out write inhibit processing (step S3).

When the CPU 217 determines that write protect is not ON, the CPU issues a write page buffer instruction and reads out data of 512 bytes from the hard disc 211, for example. The write page buffer instruction and the page of data are supplied via the serial I/F 215 to the memory card (step S4).

Furthermore, the CPU issues a set command instruction and a write instruction including a write address for identifying the address at which the data is to be written on the memory card 202 (step S5). The CPU transmits these command instructions via the serial I/F 215 to the memory card.

In the memory card, when the command generator 235 receives the set command instruction from the host via the S/P & P/S sequencer 231, the command generator sets a busy state in the aforementioned register and transmits a busy signal representing this register content via the S/P & P/S sequencer 231 to the host (step S12). It should be noted that this busy signal is repeatedly transmitted to the host until the ready state is set in the register by the command generator.

Then, the command generator issues a write command to write one page of the data into the aforementioned identified address of the flash memory 222 (step S13). When the writing of the one page of data is complete, the command generator 235 sets a ready state in the register and transmits a ready signal representing this register content via the S/P & P/S sequencer to the host computer (step S14).

At this time, the CPU 217 in the host terminates the set command instruction (step S5) and issues a read status instruction to check the state of the memory card 202 (step S6). The CPU 217 senses whether the signal transmitted from the memory card via the serial I/F 205 is a busy signal. If it is, the CPU again issues the read status instruction (step S6). That is, while the busy signal is transmitted from the memory card, the CPU cycles through steps S6 and S7.

When the CPU 217 senses that the signal transmitted from the memory card is not a busy signal, i.e., that the signal transmitted is a ready signal, the CPU determines whether more data is to be transmitted to the memory card. If so, control is passed to step S4; and if no further data is to be transmitted, the data transmission processing is terminated (step S8). That is, a file data to be recorded is written on a page basis into the memory card by repeating the processing of steps S4 to S8 and the processing of steps S12 to S14 until the file is written.

As has been described above, the ON/OFF state for write protect of the memory card is determined for each file recording. Consequently, if the write protect state of the erase prevention switch 223 is changed while the memory card 2 is mounted on or in the host computer, the writing of data may be inhibited, depending upon the state of this switch. Since the state of the erase prevention switch 223 can be changed while the memory card is mounted on the host computer, there is no need to remove the memory card from the host in order to switch the erase prevention switch, thus improving operability for the user.

Figure 38:
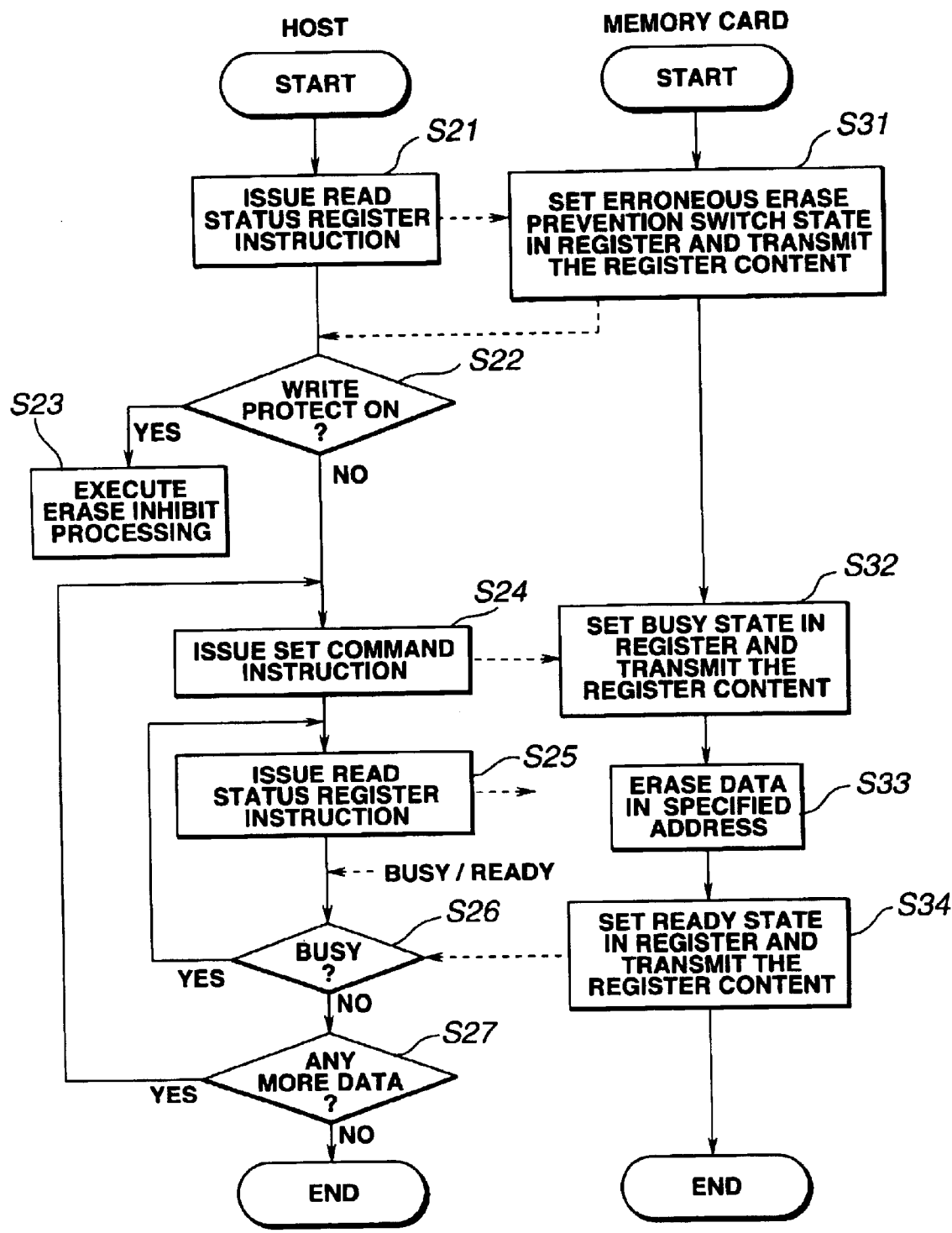
FIG. 38 is a flow chart which explains another operation procedure of the host and the memory card.

Next is described the operation of erasing data stored in the memory card 202. When erasing data, the host carries out the processing represented by steps S21 to S27 while the memory card carries out the processing represented by steps S31 to S34, as shown in FIG. 38.

In the host, when data stored in the memory card is to be erased, the CPU 217 issues a read status instruction (step S21) so as to check the state of the memory card, and this read status instruction is transmitted via the serial I/F 215 to the memory card 202. It should be noted that this read status instruction is issued for each of the files to be erased.

In the memory card, when the command generator 235 receives the read status instruction, the command generator loads the state of the erase prevention switch 223 into the aforementioned register, and transmits the register content via the S/P & P/S sequencer 231 to the host computer (step S31). In other words, the command generator loads the register with the ON or OFF write protect state of the memory card and transmits this register content to the host.

In the host, the CPU 217 determines whether the write protect is ON, based upon the register content transmitted from the memory card (step S22) and if write protect is ON, data erasure is inhibited (step S23).

If write protest is OFF, the CPU issuses a set command instrction and issuses an erase instruction (step S24) to erase the data stored in a specified address in the memory card. The CPU transmits these instructions via the serial I/F 215 to the memory card.

In the memory card, upon receipt of the aforementioned set command instruction from the host, the command generator 235 transmits a busy signal via the S/P & P/S sequencer 231 to the host (step S32). The command generator also issues a command to erase the data stored in the specified address in the flash memory 222 (step S33). It should be noted that in the flash memory, the data is erased for each block consisting of a predetermined number of sets of one-page (512 bytes) data and 18-bytes management information.

When data erasure is complete, the command generator 235 loads a ready state in the register and transmits a ready signal representing the register content via the S/P & P/S sequencer 231 to the host (step S34).

At the host, the CPU 217 terminates the set command instruction produced in step S24, and then issues a read status instruction to check the state of the memory card (step S25). The CPU 217 senses whether the signal transmitted from the memory card via the serial I/F 215 is a busy signal, and if it is, the read status instruction is again issued (step S26). Consequently, while the busy signal is transmitted from the memory card, the CPU cycles through steps S25 and S26.

When the CPU 217 senses that the signal transmitted form the memory card is not a busy signal, i.e., the signal transmitted is a ready signal, the CPU determines whether more data is to be erased from the memory card. If so, control is passed to step S24; and if no further data is to be erased, the data erase processing is terminated (step S27). That is, the file of data to be erased is erased on a block basis by repeatedly carrying out the processing represented by steps S24 to S27 and steps S32 to S34.

As has been described, the ON/OFF state of write protect of the memory card is checked for each file to be erased, and if the write protect state is changed by switching the erase prevention switch 223 while the memory card is mounted on the host, the erasing of data may be inhibited, depending upon the state of the switch.

It should be noted that the present invention is not to be limited to the particular embodiment described above, but can be modified without departing from the scope of the invention. For example, the slidable erase prevention switch can be provided at one end of the rectangular card body, as shown in FIG. 3, or it may be provided on the surface of the card body, as shown in FIG. 30.

In one application of the present invention, the information data is video data. In another application, the information data is audio data and the host is, for example, a digital voice or music recorder or playback device. In yet another application, the information data is received from a data distribution network, such as the internet, and may be, for example, electronic music data, video data, text data, or the like. Here, the host may be interface apparatus connectable to the network. In a further application the information data is image data and the host is a portable scanner for producing such image data.

What is claimed is:

1. A memory card for storing data written thereto from an external device, comprising:

a substantially rectangular card body having first and second substantially rectangular surfaces and edges between said surfaces;

terminals provided in the vicinity of one of the edges between said surfaces and on said first substantially rectangular surface for inputting data from or outputting data to said external device;

a storage device disposed in said card body for storing said data inputted from said terminals;

an electric switch located on said first substantially rectangular surface and operable to a state to prevent the data stored in said storage device from being erased; and a control circuit disposed within said card body and electrically connected between said terminals and said storage device for writing data from an external device to said storage device, for reading out stored data to said terminals from said storage device and for supplying to said terminals a status signal representing the state of said switch;

said switch being disposed proximate said terminals and electrically connected to said control circuit.

2. The memory card of claim 1 wherein said switch has a slide member located in a recess disposed on said one surface.

3. The memory card of claim 2 wherein said switch is reciprocally movable in a side-to-side manner toward one and away from the other of longitudinal ones of said edges, the state of said switch being determined by the position thereof.

4. A memory card for storing data written thereto from an external device, comprising:
- a substantially rectangular card body having first and second substantially rectangular surfaces and edges between said surfaces;
- terminals provided in the vicinity of one of the edges between said surfaces and on said first substantially rectangular surface for inputting data from or outputting data to said external device;
- a storage device disposed in said card body for storing said data inputted from said terminals;
- an electric switch located on said first substantially rectangular surface and operable to a state to prevent the data stored in said storage device from being erased; and
- a control circuit disposed within said card body and electrically connected between said terminals and said storage device for writing data from an external device to said storage device, for reading out stored data to said terminals from said storage device and for supplying to said terminals a status signal representing the state of said switch, wherein said control circuit is responsive to a read status instruction signal from said external device to supply said status signal to said terminals;
- said switch being disposed proximate said terminals and electrically connected to said control circuit.

5. The memory card of claim 4 wherein said control circuit is responsive to a write instruction signal from said external device to write data to said storage device; and wherein said read status instruction signal precedes said write instruction signal.

6. The memory card of claim 4 wherein said control circuit is responsive to an erase instruction signal from said external device to erase data stored in said storage device; and wherein said read status instruction signal precedes said erase instruction signal.

7. The memory card of claim 4 wherein said data written to said storage device comprises a data file; and wherein said read status instruction signal is supplied prior to writing a data file to or erasing a data file from said storage device.

8. The memory card of claim 1 wherein said switch is operable while said memory card is used with said external device.

9. The memory card of claim 1 wherein said control circuit receives signals from and transmits signals to said external device in serial form.

10. A memory card for storing data written thereto from an external device, comprising:
- a substantially rectangular card body having first and second substantially rectangular surfaces and edges between said surfaces;
- terminals provided in the vicinity of one of the edges between said surfaces and on said first substantially rectangular surface for inputting data from or outputting data to said external device;
- a storage device disposed in said card body for storing said data inputted from said terminals;
- an electric switch located on one of the edges between said surfaces and operable to a state to prevent the data stored in said storage device from being erased; and
- a control circuit disposed within said card body and electrically connected between said terminals and said storage device for writing data from an external device to said storage device, for reading out stored data to said terminals from said storage device and for supplying to said terminals a status signal representing the state of said switch, said control circuit being responsive to a read status instruction signal from said external device to supply said status signal to said terminals;
- and said switch being electrically connected to said control circuit.

11. The memory card of claim 10 wherein said switch has a slide member located in a recess disposed on said one edge.

12. The memory card of claim 10 wherein said control circuit is responsive to a write instruction signal from said external device to write data to said storage device; and wherein said read status instruction signal precedes said write instruction signal.

13. The memory card of claim 10 wherein said control circuit is responsive to an erase instruction signal from said external device to erase data stored in said storage device; and wherein said read status instruction signal precedes said erase instruction signal.

14. The memory card of claim 10 wherein said data written to said storage device comprise a data file; and wherein said read status instruction signal is supplied prior to writing a data file to or erasing a data file from said storage device.

15. The memory card of claim 10 wherein said switch is operable while said memory card is used with said external device.

16. The memory card of claim 10 wherein said control circuit receives data from and transmits data to said external device in serial form.

17. A system comprising:
- a memory card for storing data written thereto from an external device, including:
- a substantially rectangular card body having first and second substantially rectangular surfaces and edges between said surfaces;
- terminals provided in the vicinity of one of the edges between said surfaces and on said first substantially rectangular surface for inputting data from or outputting data to said external device;
- a storage device disposed in said card body for storing said data inputted from said terminals;
- an electric switch located on said first substantially rectangular surface and operable to a state to prevent the data stored in said storage device from being erased; and
- a control circuit disposed within said card body and electrically connected between said terminals and said storage device for writing data from an external device to said storage device, for reading out stored data to said terminals from said storage device and for supplying to said terminals a status signal representing the state of said switch;
- said switch being disposed proximate said terminals and electrically connected to said control circuit; and
- host apparatus for receiving and communicating with said memory card, said host apparatus including:
- terminals for transmitting signals to and reading this signals from said memory card; and a control circuit electrically connected to the terminals of said host apparatus for writing information to said memory card and for receiving from said terminals of said host apparatus a status signal representing the state of said switch on said memory card.

18. The system of claim 17 wherein said switch has a slide member located in a recess disposed on said one surface.

19. The system of claim 18 wherein said switch is reciprocally movable in a side-to-side manner toward one and away from the other of longitudinal ones of said edges, the state of said switch being determined by the position thereof.

20. A system comprising:
a memory card for storing data written thereto from an external device, including:
a substantially rectangular card body having first and second substantially rectangular surfaces and edges between said surfaces;
terminals provided in the vicinity of one of the edges between said surfaces and on said first substantially rectangular surface for inputting data from or outputting data to said external device;
a storage device disposed in said card body for storing said data inputted from said terminals;
an electric switch located on said first substantially rectangular surface and operable to a state to prevent the data stored in said storage device from being erased; and
a control circuit disposed within said card body and electrically connected between said terminals and said storage device for writing data from an external device to said storage device, for reading out stored data to said terminals from said storage device and for supplying to said terminals a status signal representing the state of said switch, wherein said control circuit is responsive to a read status instruction signal from said external device to supply said status signal to said terminals;
said switch being disposed proximate said terminals and electrically connected to said control circuit; and
host apparatus for receiving and communicating with said memory card, said host apparatus including:
terminals for transmitting signals to and reading this signals from said memory card; and
a control circuit electrically connected to the terminals of said host apparatus for writing information to said memory card and for receiving from said terminals of said host apparatus a status signal representing the state of said switch on said memory card.

21. The system of claim 20 wherein said control circuit is responsive to a write instruction signal from said external device to write data to said storage device; and wherein said read status instruction signal precedes said write instruction signal.

22. The system of claim 20 wherein said control circuit is responsive to an erase instruction signal from said external device to erase data stored in said storage device; and wherein said read status instruction signal precedes said erase instruction signal.

23. The system of claim 20 wherein said data written to said storage device comprises a data file; and wherein said read status instruction signal is supplied prior to writing a data file to or erasing a data file from said storage device.

24. The system of claim 17 wherein said switch is operable while said memory card is used with said external device.

25. The system of claim 17 wherein said control circuit receives signals from and transmits signals to said external device in serial form.

26. A system comprising:
a memory card for storing data written thereto from an external device, including:
a substantially rectangular card body having first and second substantially rectangular surfaces and edges between said surfaces;
terminals provided in the vicinity of one of the edges between said surfaces and on said first substantially rectangular surface for inputting data from or outputting data to said external device;
a storage device disposed in said card body for storing said data inputted from said terminals;
an electric switch located on one of the edges between said surfaces and operable to a state to prevent the data stored in said storage device from being erased; and
a control circuit disposed within said card body and electrically connected between said terminals and said storage device for writing data from an external device to said storage device, for reading out stored data to said terminals from said storage device and for supplying to said terminals a status signal representing the state of said switch, said control circuit being responsive to a read status instruction signal from said external device to supply said status signal to said terminals;
and said switch being electrically connected to said control circuit; and
host apparatus for receiving and communicating with said memory card, said host apparatus including:
terminals for transmitting signals to and reading this signals from said memory card; and
a control circuit electrically connected to the terminals of said host apparatus for writing information to said memory card and for receiving from said terminals of said host apparatus a status signal representing the state of said switch on said memory card.

27. The system of claim 26 wherein said switch has a slide member located in a recess disposed on said one edge.

28. The system of claim 26 wherein said control circuit is responsive to a write instruction signal from said external device to write data to said storage device; and wherein said read status instruction signal precedes said write instruction signal.

29. The system of claim 26 wherein said control circuit is responsive to an erase instruction signal from said external device to erase data stored in said storage device; and wherein said read status instruction signal precedes said erase instruction signal.

30. The system of claim 26 wherein said data written to said storage device comprise a data file; and wherein said read status instruction signal is supplied prior to writing a data file to or erasing a data file from said storage device.

31. The system of claim 26 wherein said switch is operable while said memory card is used with said external device.

32. The system of claim 26 wherein said control circuit receives data from and transmits data to said external device in serial form.

* * * * *